(12) United States Patent
Huang

(10) Patent No.: US 11,658,115 B2
(45) Date of Patent: May 23, 2023

(54) SEMICONDUCTOR DEVICE WITH COPPER-MANGANESE LINER AND METHOD FOR FORMING THE SAME

(71) Applicant: NANYA TECHNOLOGY CORPORATION, New Taipei (TW)

(72) Inventor: Chin-Ling Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 53 days.

(21) Appl. No.: 17/240,287

(22) Filed: Apr. 26, 2021

(65) Prior Publication Data
US 2022/0344261 A1 Oct. 27, 2022

(51) Int. Cl.
*H01L 23/532* (2006.01)
*H01L 23/525* (2006.01)

(52) U.S. Cl.
CPC .... *H01L 23/5256* (2013.01); *H01L 23/53238* (2013.01)

(58) Field of Classification Search
CPC ............ H01L 27/11206; H01L 23/525; H01L 23/5256; H01L 23/532; H01L 23/53238; H01L 23/48; H01L 23/60; H01L 23/62; H01L 23/481; H01L 23/528; H01L 23/538; H01L 23/5252; H01L 23/5283; H01L 23/5286; H01L 23/52328; H01L 29/417; H01L 29/456; H01L 29/41725; H01L 27/02; H01L 27/048; H01L 27/0296; H01L 21/768; H01L 21/76877; H01L 21/76895
USPC ......................................................... 257/529
See application file for complete search history.

(56) References Cited

U.S. PATENT DOCUMENTS

| | | | |
|---|---|---|---|
| 2011/0175226 A1* | 7/2011 | Bonilla | H01L 23/5226 257/E21.585 |
| 2014/0332924 A1* | 11/2014 | Bao | H01L 23/53271 257/529 |
| 2015/0235944 A1* | 8/2015 | Filippi | H01L 23/53238 257/532 |
| 2017/0278790 A1 | 9/2017 | Edelstein et al. | |
| 2020/0126911 A1 | 4/2020 | Li et al. | |

* cited by examiner

*Primary Examiner* — Chuong A Luu
(74) *Attorney, Agent, or Firm* — Muncy, Geissler, Olds & Lowe, P.C.

(57) ABSTRACT

The present disclosure provides a semiconductor device with a copper-manganese liner and a method for forming the semiconductor device. The semiconductor device includes a first electrode and a second electrode disposed in a first dielectric layer. The semiconductor device also includes a first liner separating the first electrode from the first dielectric layer. The semiconductor device further includes a fuse link disposed in the first dielectric layer. The fuse link is disposed between and electrically connected to the first electrode and the second electrode, and the fuse link and the first liner are made of copper-manganese (CuMn).

7 Claims, 22 Drawing Sheets

SEMICONDUCTOR DEVICE WITH COPPER-MANGANESE LINER AND METHOD FOR FORMING THE SAME

TECHNICAL FIELD

The present disclosure relates to a semiconductor device and a method for forming the same, and more particularly, to a semiconductor device with a copper-manganese liner and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as void formed in conductive structure, which results from the difficulties in filling a high aspect ratio opening. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first electrode and a second electrode disposed in a first dielectric layer. The semiconductor device also includes a first liner separating the first electrode from the first dielectric layer. The semiconductor device further includes a fuse link disposed in the first dielectric layer. The fuse link is disposed between and electrically connected to the first electrode and the second electrode, and the fuse link and the first liner are made of copper-manganese (CuMn).

In an embodiment, the first electrode and the second electrode are made of copper (Cu). In an embodiment, the semiconductor device further includes a second liner separating the second electrode from the first dielectric layer, wherein the second liner is made of CuMn. In an embodiment, the first liner, the second liner and the fuse link are connected to form a continuous structure. In an embodiment, a top surface of the first liner is coplanar with a top surface of the first electrode.

In an embodiment, the semiconductor device further includes a second dielectric layer disposed over the first dielectric layer, and a plurality of conductive contacts disposed in the second dielectric layer, wherein a first set of the plurality of conductive contacts is electrically connected to the first electrode, and a second set of the plurality of conductive contacts is electrically connected to the second electrode. In an embodiment, the semiconductor device further includes a patterned mask disposed between the first dielectric layer and the second dielectric layer, wherein a top surface of the fuse link is coplanar with a top surface of the patterned mask.

In another embodiment of the present disclosure, a semiconductor device is provided. The semiconductor device includes a first well region and a second well region disposed in a semiconductor substrate. The semiconductor device also includes a first dielectric layer disposed over the semiconductor substrate and covering the first well region and the second well region, and a gate structure disposed over the first dielectric layer and between the first well region and the second well region. The semiconductor device further includes a conductive structure disposed over and separated from the first well region by a portion of the first dielectric layer. The conductive feature includes a barrier layer and a conductive plug disposed over the barrier layer, and the barrier layer is made of copper-manganese (CuMn). The first well region, the conductive structure and the portion of the first dielectric layer form an anti-fuse structure.

In an embodiment, the conductive plug of the conductive structure is made of copper (Cu). In an embodiment, the barrier layer covers a bottom surface and sidewalls of the conductive plug. In an embodiment, the semiconductor device further includes a gate conductive plug disposed over the gate structure, wherein the conductive plug of the conductive structure and the gate conductive plug are made of different materials.

In an embodiment, the semiconductor device further includes a second dielectric layer disposed over the first dielectric layer, wherein the gate structure, the conductive structure and the gate conductive plug are disposed in the second dielectric layer, and wherein the first dielectric layer and the second dielectric layer are made of different materials. In an embodiment, the semiconductor device further includes a deep well region disposed in the semiconductor substrate, wherein the first well region and the second well region are disposed in the deep well region. In an embodiment, the first well region and the second well region have a first conductivity type, and the deep well region has a second conductivity type opposite to the first conductivity type.

In yet another embodiment of the present disclosure, a method for forming a semiconductor device is provided. The method includes forming an opening structure in a first dielectric layer. The opening structure has a first portion, a second portion and a third portion disposed between and physically connecting the first portion and the second portion. The method also includes forming a lining material lining the first portion and the second portion of the opening structure and completely filling the third portion of the opening structure. The lining material is made of copper-manganese (CuMn). The method further includes filling the first portion and the second portion of the opening structure with a conductive material after the lining material is formed, and performing a planarization process on the lining material and the conductive material.

In an embodiment, the first portion of the opening structure has a first width, the second portion of the opening structure has a second width, the third portion of the opening structure has a third width, the first width, the second width and the third width are parallel to each other, and wherein the first width and the second width are both greater than the third width. In an embodiment, forming the opening structure in the first dielectric layer includes using a patterned mask as an etching mask, and wherein the planarization process is performed until the patterned mask is exposed. In an embodiment, the conductive material is made of copper (Cu).

In an embodiment, after the planarization process is performed, a remaining portion of the lining material in the third portion of the opening structure is configured as a fuse link, a remaining portion of the conductive material in the first portion of the opening structure is configured as a first electrode, and a remaining portion of the conductive material in the second portion of the opening structure is configured as a second electrode, and wherein the first electrode, the second electrode and the fuse link form a fuse structure. In an embodiment, the method further includes forming a second dielectric layer over the fuse structure, and forming a plurality of conductive contacts penetrating through the second dielectric layer, wherein a first set of the plurality of conductive contacts is electrically connected to the first electrode, and a second set of the plurality of conductive contacts is electrically connected to the second electrode.

Embodiments of a semiconductor device and method for forming the same are provided in the disclosure. In some embodiments, the semiconductor device includes a conductive structure (e.g., an electrode or a conductive plug) disposed in a dielectric layer, and a copper-manganese (CuMn) liner or barrier layer separating the conductive structure from the dielectric layer. In some embodiment, the conductive structure is made of copper (Cu), and the CuMn liner or barrier layer is configured to reduce or prevent voids from forming in the conductive structure, thereby reducing the contact resistance and improving the electromigration reliability of the conductive structure. As a result, the device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
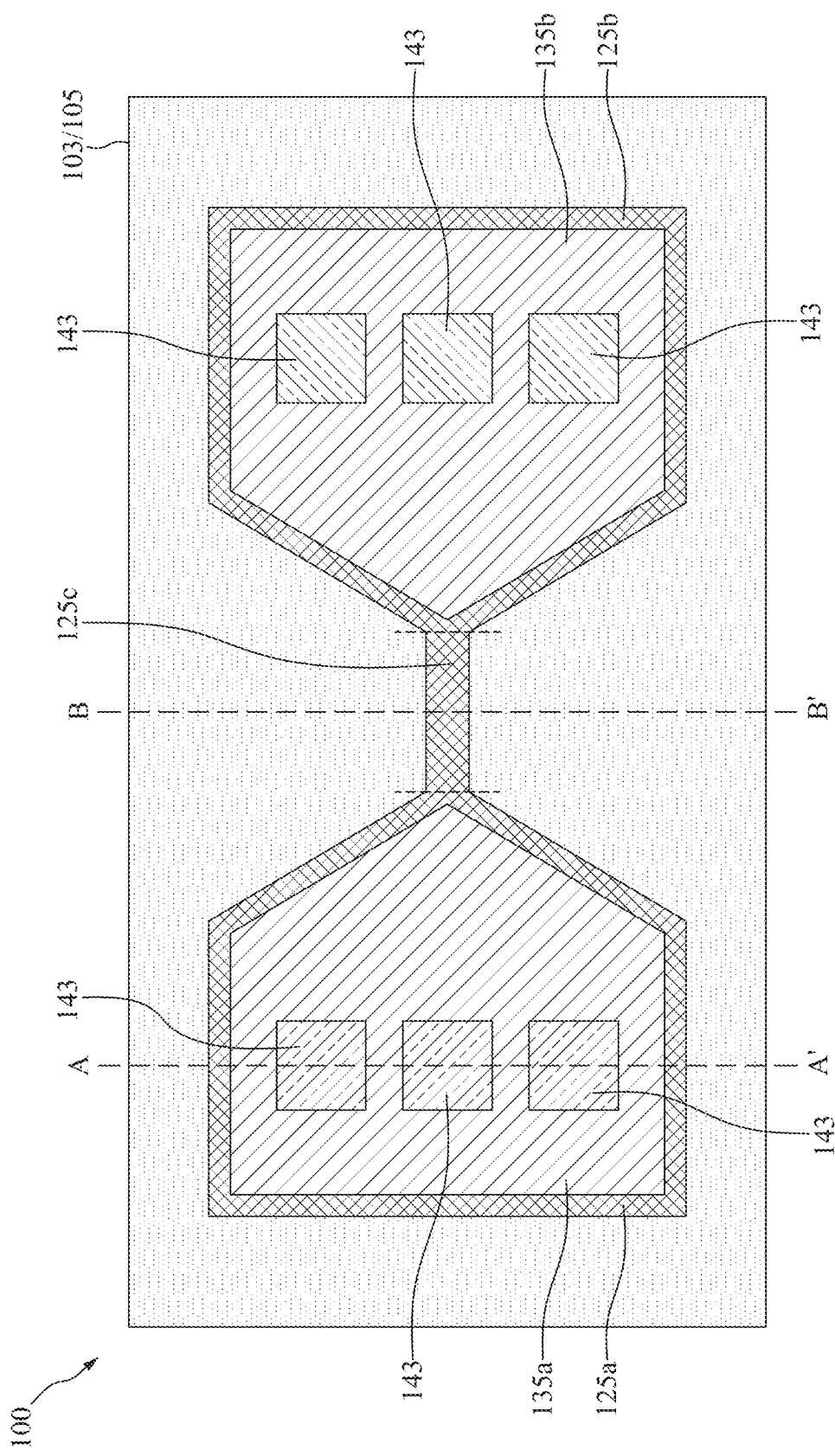
FIG. 1 is a top view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
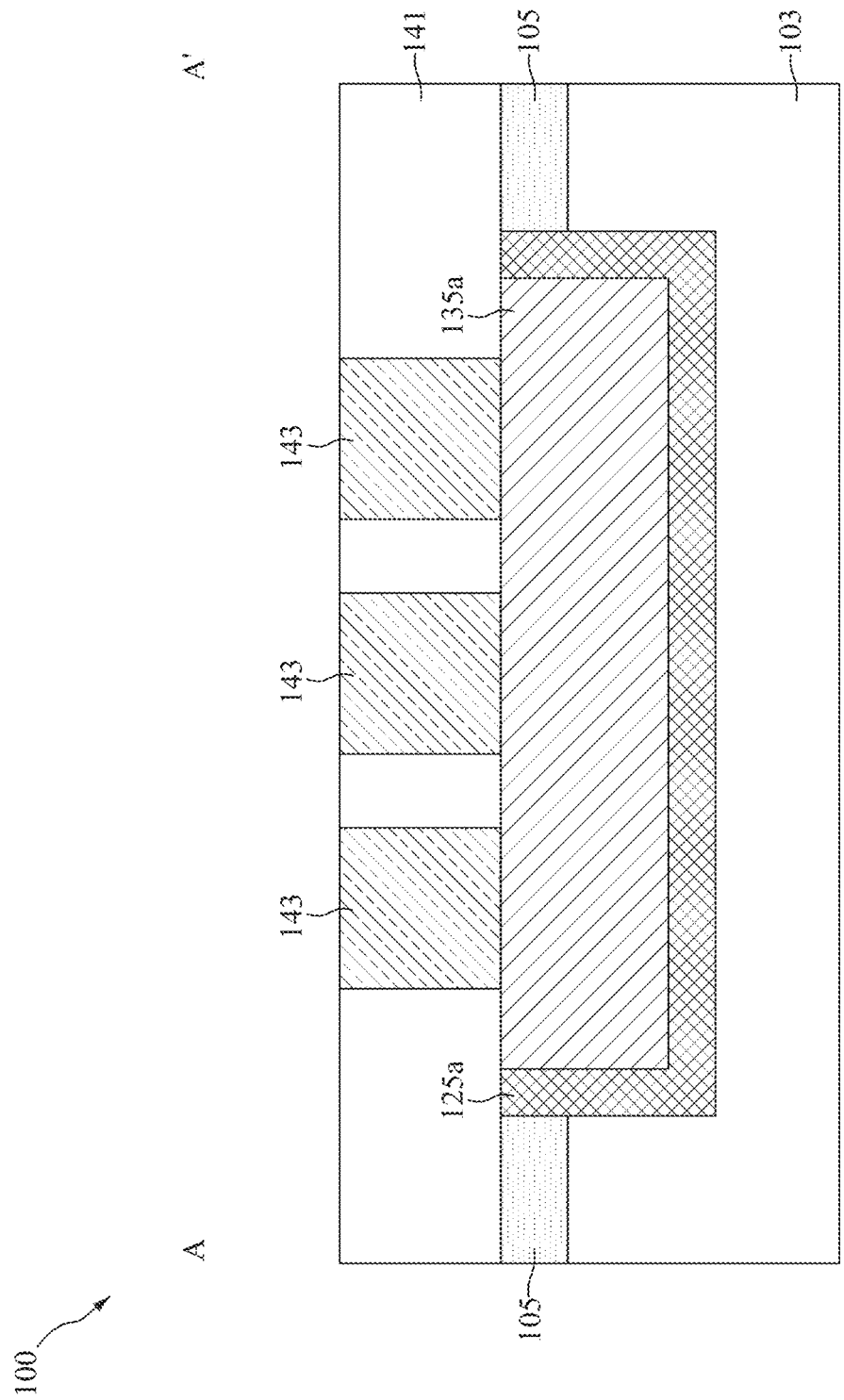
FIG. 2 is a cross-sectional view illustrating the semiconductor device along the sectional line A-A' of FIG. 1, in accordance with some embodiments.
Figure 3:
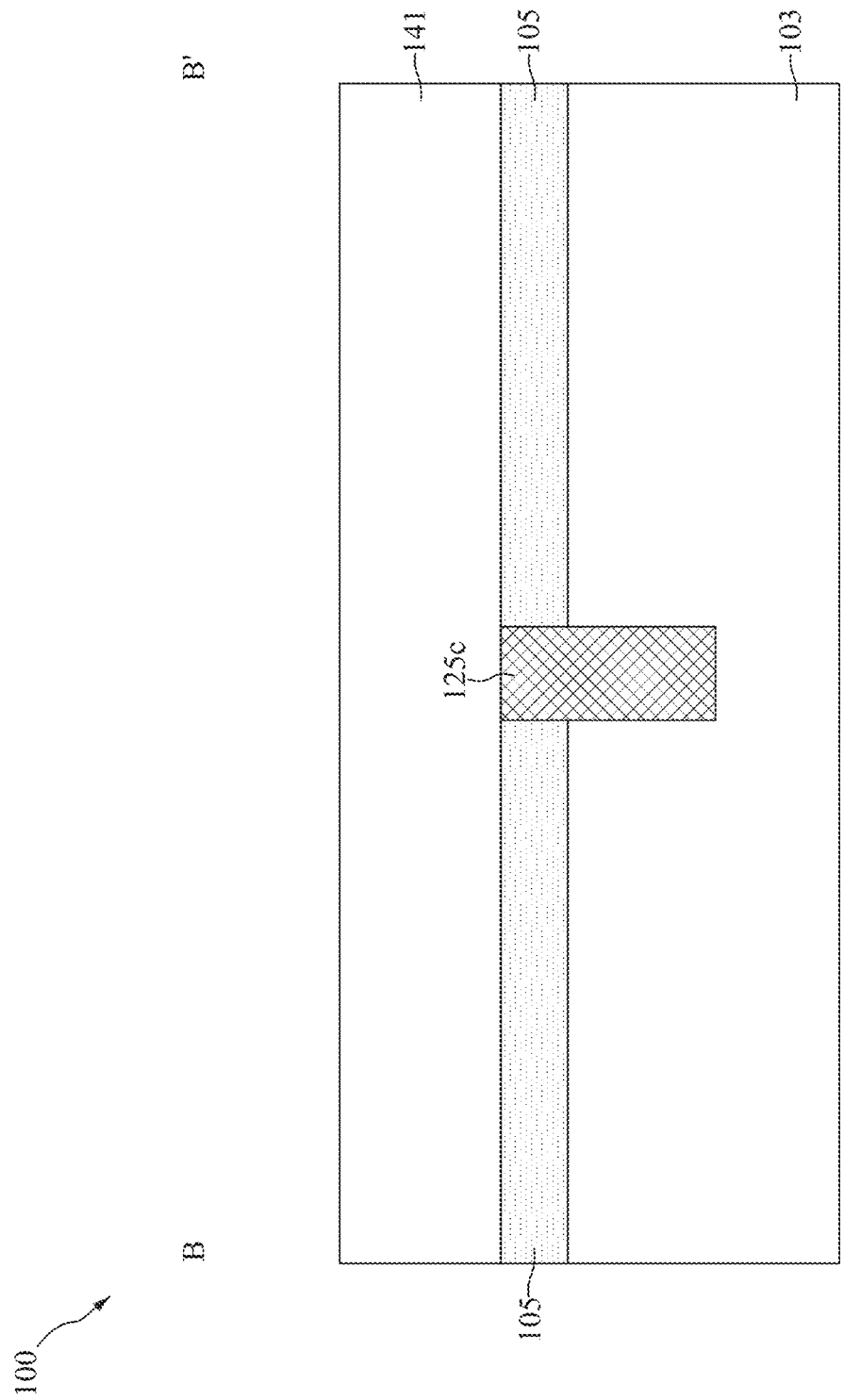
FIG. 3 is a cross-sectional view illustrating the semiconductor device along the sectional line B-B' of FIG. 1, in accordance with some embodiments.

FIG. 1 is a top view illustrating a semiconductor device 100, and FIGS. 2 and 3 are cross-sectional views illustrating the semiconductor device 100 along the sectional lines A-A' and B-B' of FIG. 1, respectively, in accordance with some embodiments. In some embodiments, the semiconductor device 100 is a fuse structure. As shown in FIGS. 1 to 3, the semiconductor device 100 includes a first dielectric layer 103, a patterned mask 105 disposed over the first dielectric layer 103, and a second dielectric layer 141 disposed over the patterned mask 105. Note that the second dielectric layer 141 shown in FIGS. 2 and 3 are not shown in the top view of FIG. 1, in order to simplify the drawing.

Moreover, the semiconductor device 100 includes a first electrode 135a, a second electrode 135b, a first liner 125a, a second liner 125b and a fuse link 125c disposed in the first dielectric layer 103. Specifically, the lower portions of the first electrode 135a, the second electrode 135b, the first liner 125a, the second liner 125b and the fuse link 125c are embedded in the first dielectric layer 103, and the upper portions of the first electrode 135a, the second electrode 135b, the first liner 125a, the second liner 125b and the fuse link 125c are embedded in the patterned mask 105, in accordance with some embodiments.

In some embodiments, the first electrode 135a is separated from the second electrode 135b, and the fuse link 125c is disposed between and electrically connected to the first electrode 135a and the second electrode 135b. In some embodiments, the first electrode 135a is surrounded by the first liner 125a, and the second electrode 135b is surrounded by the second liner 125b. Specifically, the sidewalls and the bottom surface of the first electrode 135a are covered by the first liner 125a, and the sidewalls and the bottom surface of the second electrode 135b is covered by the second liner 125b. In other words, the first electrode 135a is separated from the first dielectric layer 103 and the patterned mask 105 by the first liner 125a, and the second electrode 135b is separated from the first dielectric layer 103 and the patterned mask 105 by the second liner 125b.

It should be noted that the first liner 125a, the second liner 125b and the fuse link 125c are physically connected to form a continuous structure with no interface therebetween. The dashed lines indicating the boundaries of the first liner 125a, the second liner 125b and the fuse link 125c in FIG. 1 are used to clarify the disclosure. No obvious interfaces exist between the first liner 125a, the second liner 125b and the fuse link 125c. In some embodiments, the first liner 125a, the second liner 125b and the fuse link 125c are formed in the same process and are formed of the same material. In some embodiments, the first liner 125a, the second liner 125b and the fuse link 125c include copper-manganese (CuMn), and the first electrode and the second electrode include copper (Cu), for example.

Still referring to FIGS. 1 to 3, the semiconductor device 100 further includes a plurality of conductive contacts 143 disposed in the second dielectric layer 141. In some embodiments, a first set of the conductive contacts 143 is disposed over and electrically connected to the first electrode 135a, and a second set of the conductive contacts 143 is disposed over and electrically connected to the second electrode 135b. Although only three conductive contacts 143 are shown over each of the first electrode 135a and the second electrode 135b in FIG. 1, any number of conductive contacts 143 may be provided over the first electrode 135a and the second electrode 135b.

Figure 4:
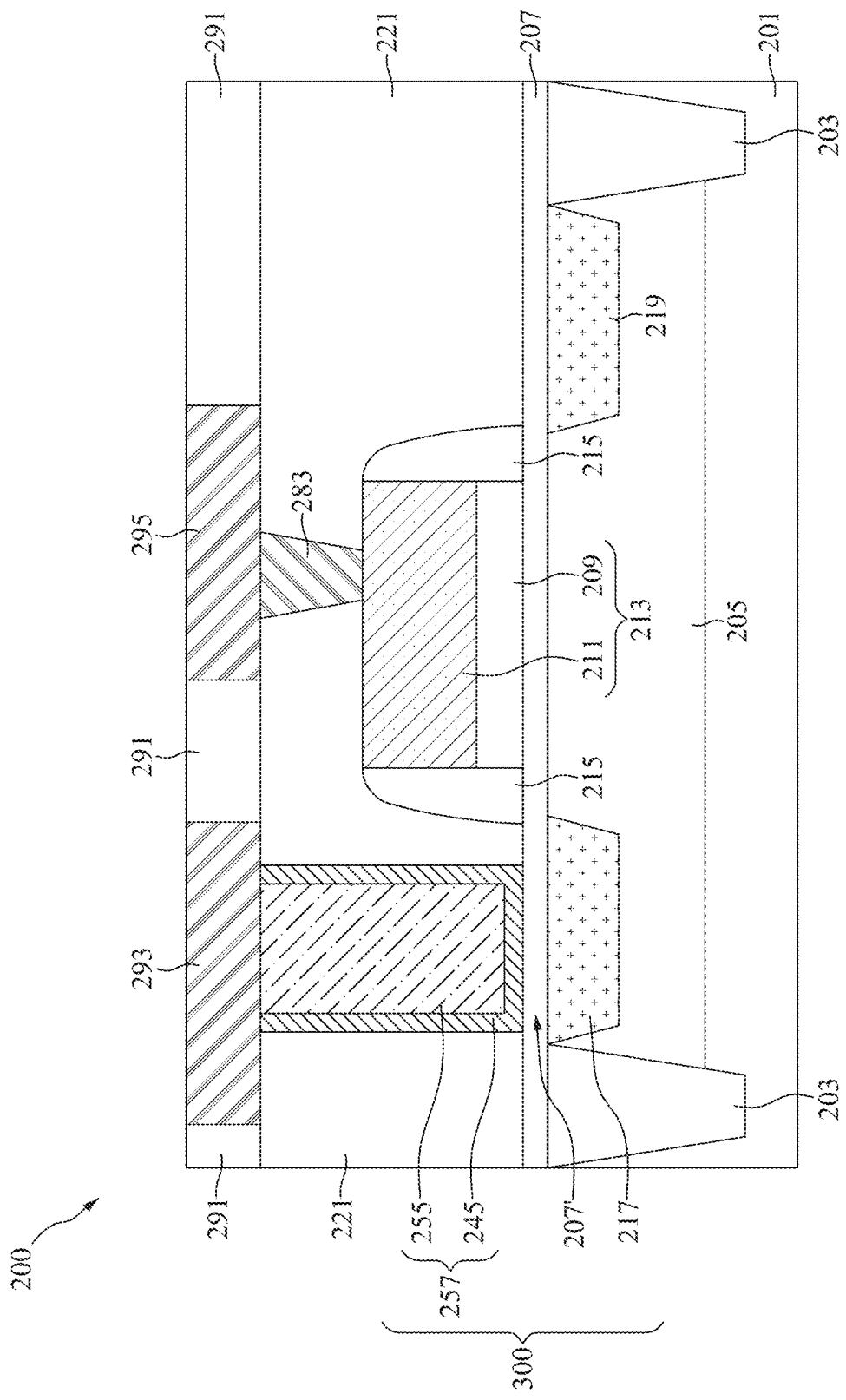
FIG. 4 is a cross-sectional view illustrating a semiconductor device, in accordance with some other embodiments.

FIG. 4 is a cross-sectional view illustrating a semiconductor device 200, in accordance with some other embodiments. In some embodiments, the semiconductor device 200 includes an anti-fuse structure 300, which will be described in detail later.

As shown in FIG. 4, the semiconductor device 200 includes a semiconductor substrate 201, a plurality of isolation structures 203 disposed in the semiconductor substrate 201, a deep well region 205 disposed in the semiconductor substrate 201 and between the isolation structures 203, and a first well region 217 and a second well region 219 disposed in the deep well region 205. In some embodiments, the first well region 217 and the second well region 219 have a first conductivity type, and the deep well region 205 has a second conductivity type opposite to the first conductivity type. For example, the deep well region 205 is lightly doped with a p-type dopant, and the first well region 217 and the second well region 219 are heavily doped with an n-type dopant.

Moreover, in some embodiments, the semiconductor device 200 includes a first dielectric layer 207 disposed over the semiconductor substrate 201 and covering the first well region 217 and the second well region 219, a gate structure 213 and a conductive structure 257 disposed over the first dielectric layer 207, and a gate conductive plug 283 disposed over the gate structure 213. In some embodiments, the gate structure 213 is disposed between the first well region 217 and the second well region 219, and the conductive structure 257 is disposed over the first well region 217. It should be noted that the conductive structure 257 is separating from the first well region 217 by a portion of the first dielectric layer 207.

In some embodiments, the gate structure 213 includes a gate dielectric layer 209 and a gate electrode layer 211 disposed over the gate dielectric layer 209. In some embodiments, gate spacers 215 are disposed on opposite sidewalls of the gate structure 213. In addition, the conductive structure 257 includes a barrier layer 245 and a conductive plug 255 disposed over the barrier layer 245. In some embodiments, the barrier layer 245 covers a bottom surface and sidewalls of the conductive plug 255. In some embodiments, the barrier layer 245 is made of CuMn, and the conductive plug 255 is made of Cu, for example.

Still referring to FIG. 4, the semiconductor device 200 further includes a second dielectric layer 221 disposed over the first dielectric layer 207, a third dielectric layer 291 disposed over the second dielectric layer 221, and conductive layers 293 and 295 disposed in the third dielectric layer 291. In some embodiments, the gate structure 213, the conductive structure 257 and the gate conductive plug 283 are disposed in the second dielectric layer 221. In some embodiments, the conductive layer 293 is disposed over and electrically connected to the conductive structure 257, and the conductive layer 295 is disposed over and electrically connected to the gate structure 213 through the gate conductive plug 283.

In some embodiments, the first dielectric layer 207 has a portion 207' sandwiched between the conductive structure 257 and the first well region 217. It should be noted that the first well region 217, the conductive structure 257 and the portion 207' of the first dielectric layer 207 collectively form the anti-fuse structure 300. The conductive structure 257 may be referred to as top electrode of the anti-fuse structure 300, and the first well region 217 may be referred to as bottom electrode of the anti-fuse structure 300.

Figure 5:
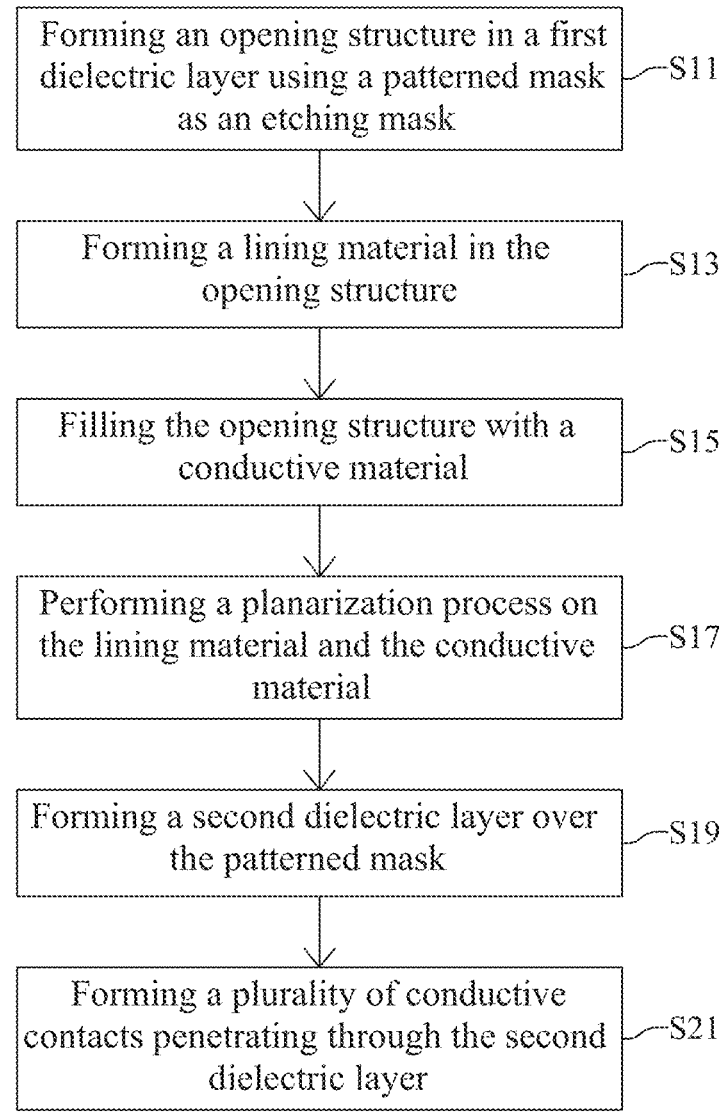
FIG. 5 is a flow diagram illustrating a method for forming a semiconductor device, in accordance with some embodiments.
Figure 6:
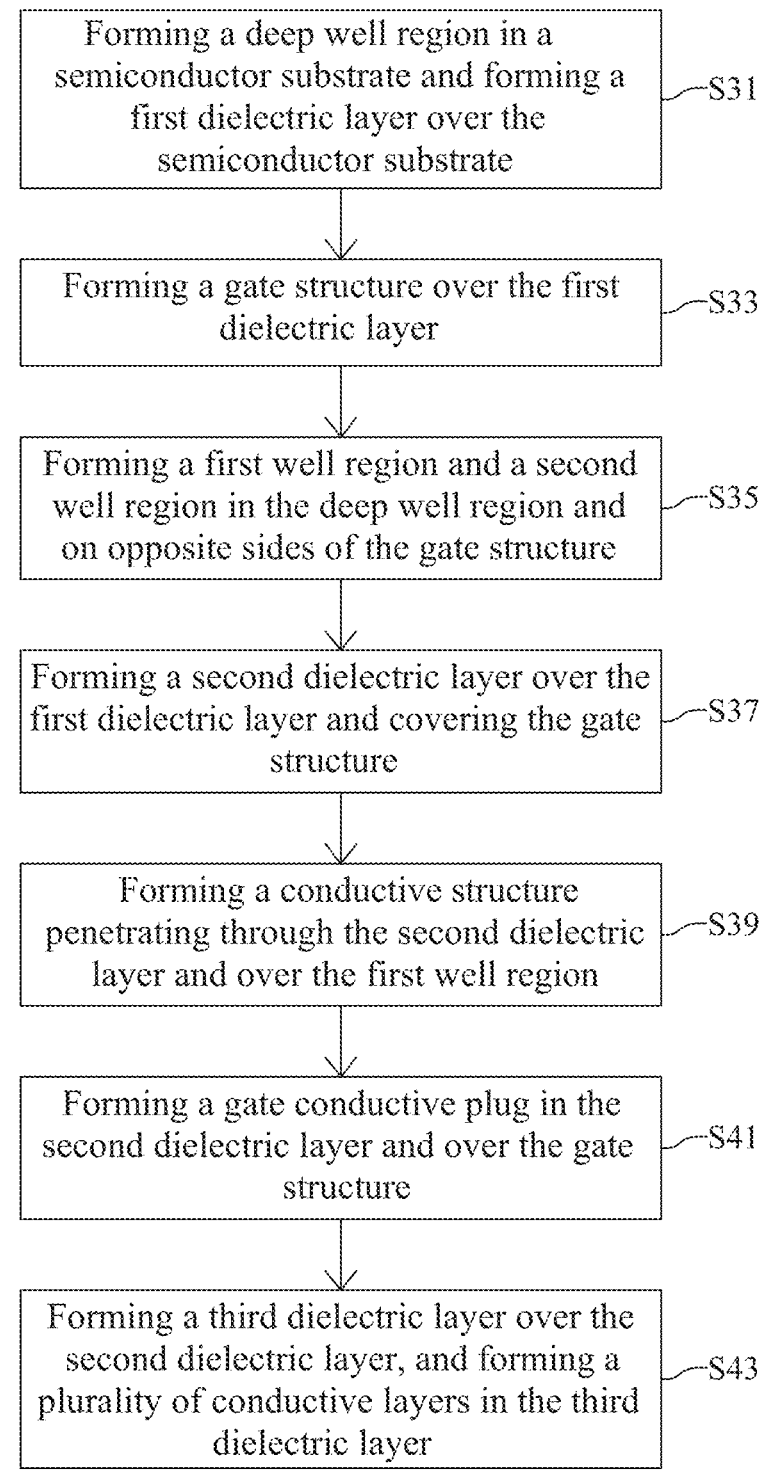
FIG. 6 is a flow diagram illustrating a method for forming a semiconductor device, in accordance with some other embodiments.

FIG. 5 is a flow diagram illustrating a method 10 for forming a semiconductor device (e.g., the semiconductor device 100), and the method 10 includes steps S11, S13, S15, S17, S19 and S21, in accordance with some embodiments. FIG. 6 is a flow diagram illustrating a method 30 for forming a semiconductor device (e.g., the semiconductor device 200), and the method 30 includes steps S31, S33, S35, S37, S39, S41 and S43, in accordance with some other embodiments. The steps S11 to S21 of FIG. 5 and the steps S31 to S43 of FIG. 6 are elaborated in connection with the following figures.

Figure 7:
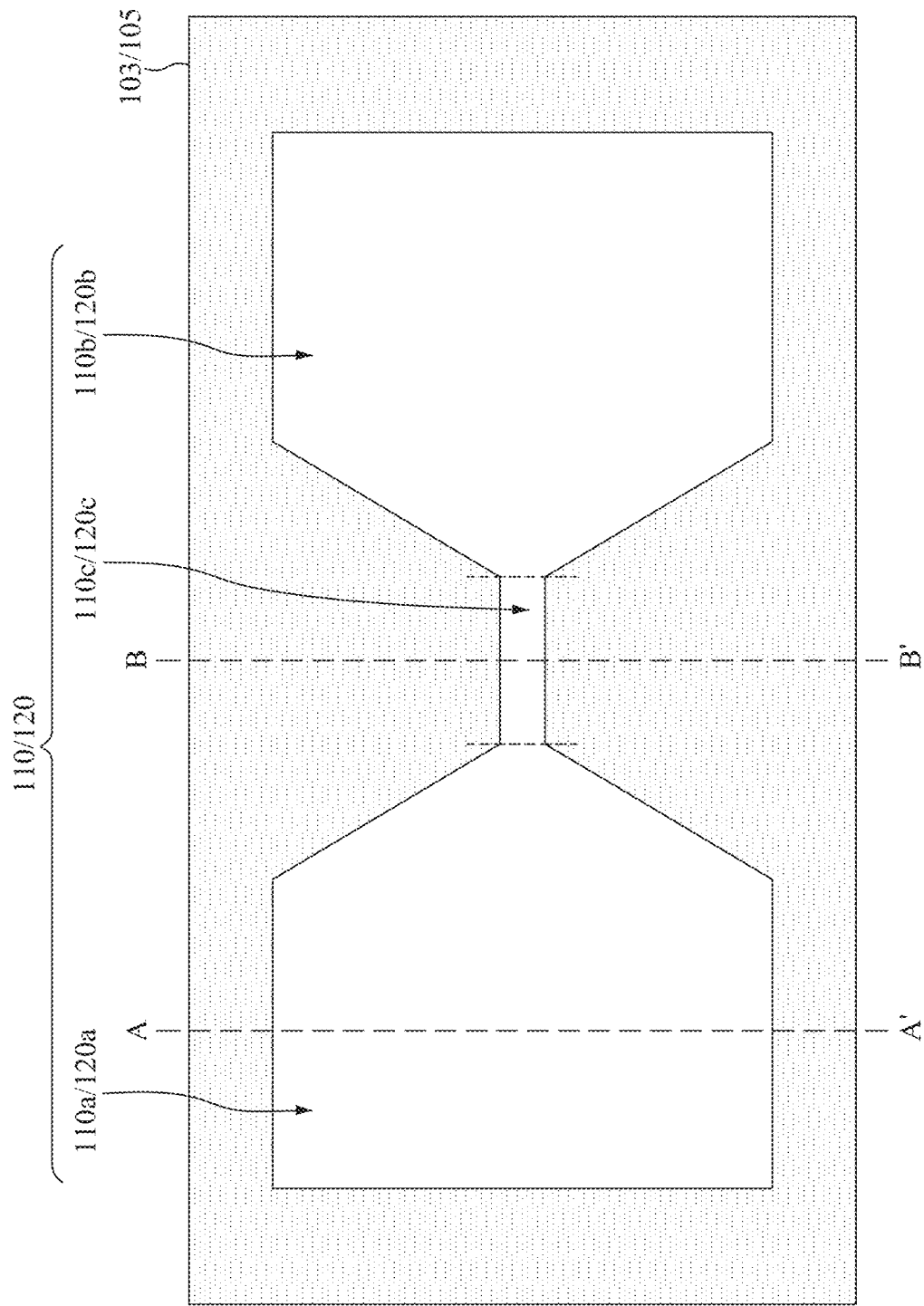
FIG. 7 is a top view illustrating an intermediate stage of forming an opening structure in a first dielectric layer during the formation of the semiconductor device, in accordance with some embodiments.
Figure 8:
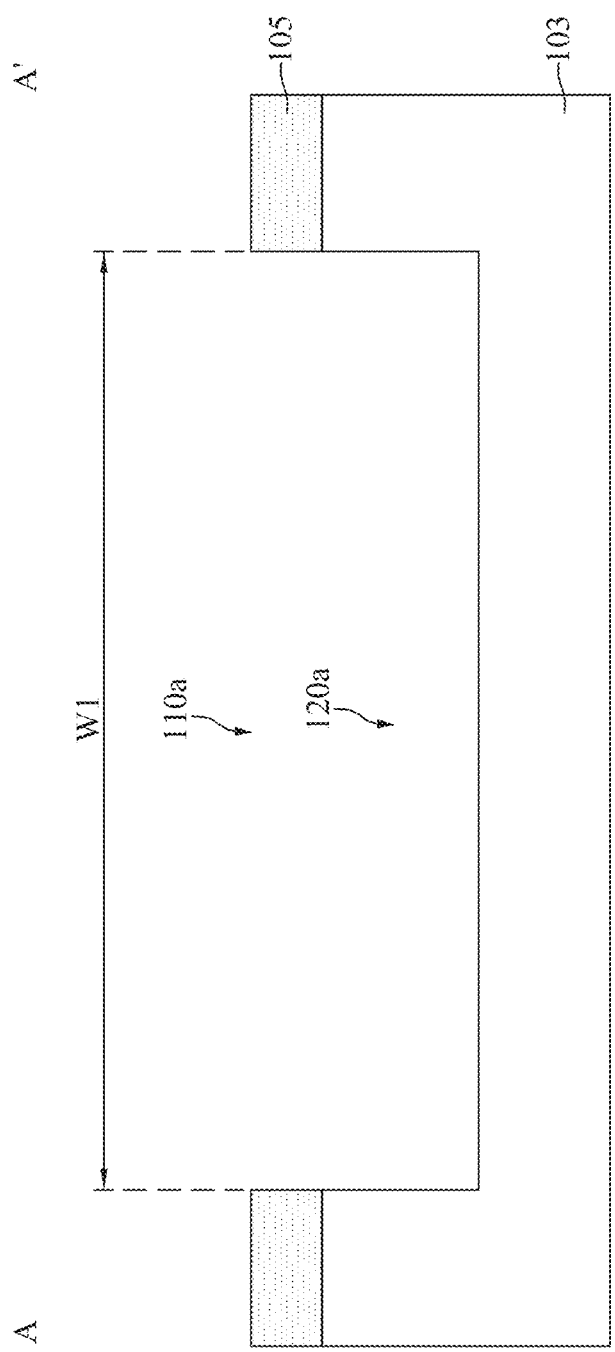
FIG. 8 is a cross-sectional view illustrating an intermediate stage in the formation of the semiconductor device along the sectional line A-A' of FIG. 7, in accordance with some embodiments.
Figure 9:
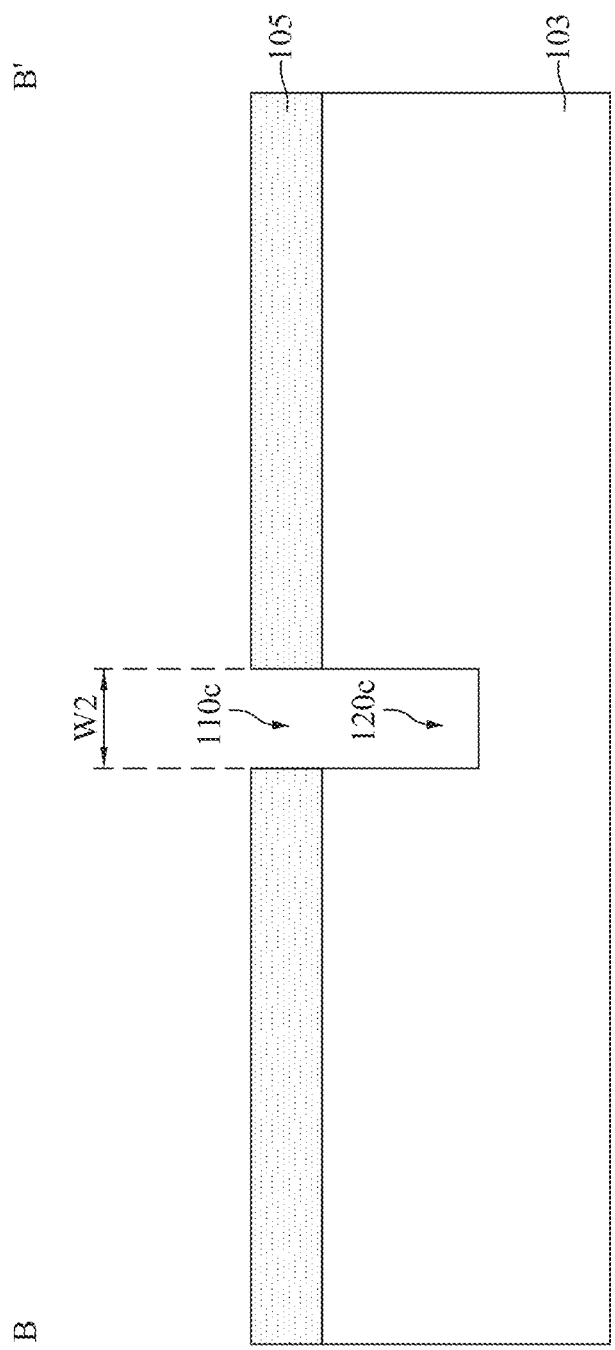
FIG. 9 is a cross-sectional view illustrating an intermediate stage in the formation of the semiconductor device along the sectional line B-B' of FIG. 7, in accordance with some embodiments.

FIG. 7 is a top view illustrating an intermediate stage of forming an opening structure 120 in a first dielectric layer 103 during the formation of the semiconductor device 100, FIG. 8 is a cross-sectional view taken along the sectional line A-A' of FIG. 7, and FIG. 9 is a cross-sectional view taken along the sectional line B-B' of FIG. 7, in accordance with some embodiments. As shown in FIGS. 7 to 9, a first dielectric layer 103 is provided, and a patterned mask 105 with an opening structure 110 is formed over the first dielectric layer 103.

In some embodiments, the first dielectric layer 103 is made of silicon oxide, silicon nitride, silicon oxynitride, a combination thereof, or another dielectric material. The first dielectric layer 103 may be formed above a semiconductor substrate (not shown), such as part of an interlayer dielectric (ILD) or intermetal dielectric (IMD) layer in a semiconductor chip. In addition, the opening structure 110 in the patterned mask 105 includes a first portion 110a, a second portion 110b and a third portion 110c disposed between and connected to the first portion 110a and the second portion 110b.

An etching process is performed on the first dielectric layer 103 using the patterned mask 105 as an etching mask, such that an opening structure 120 is formed in the first dielectric layer 103, as shown in FIGS. 7 to 9 in accordance with some embodiments. The respective step is illustrated as the step S11 in the method 10 shown in FIG. 5. In some embodiments, the etching process includes a wet etching process, a dry etching process, or a combination thereof, and the opening structure 110 is transferred from the patterned mask 105 to the first dielectric layer 103, such that the opening structure 120 is formed.

In some embodiments, the opening structure 120 does not penetrate through the first dielectric layer 103. Similar to the pattern of the opening structure 110 in the patterned mask 105, the opening structure 120 includes a first portion 120a, a second portion 120b and a third portion 120c disposed between and connected to the first portion 120a and the second portion 120b. In some embodiments, the first portion 110a of the opening structure 110 and the first portion 120a of the opening structure 120 have a width W1 (see FIG. 8), the third portion 110c of the opening structure 110 and the third portion 120c of the opening structure 120 have a width W2 (see FIG. 9), and the width W1 is greater than the width W2.

Since the profiles of the second portion 110b of the opening structure 110 and the second portion 120b of the opening structure 120 are similar to the profiles of the first portion 110a of the opening structure 110 and the first portion 120a of the opening structure 120, the cross-sectional view taken along the second portions 110b and 120b are not illustrated. In some embodiments, the second portion 110b of the opening structure 110 and the second portion 120b of the opening structure 120 have a width (not shown) that is substantially the same as the width W1 in FIG. 8. Therefore, the width of the second portions 110b and 120b is also greater than the width W2 of the third portions 110c and 120c. It should be noted that the widths W1, W2 and W3 are parallel to each other.

Figure 10:
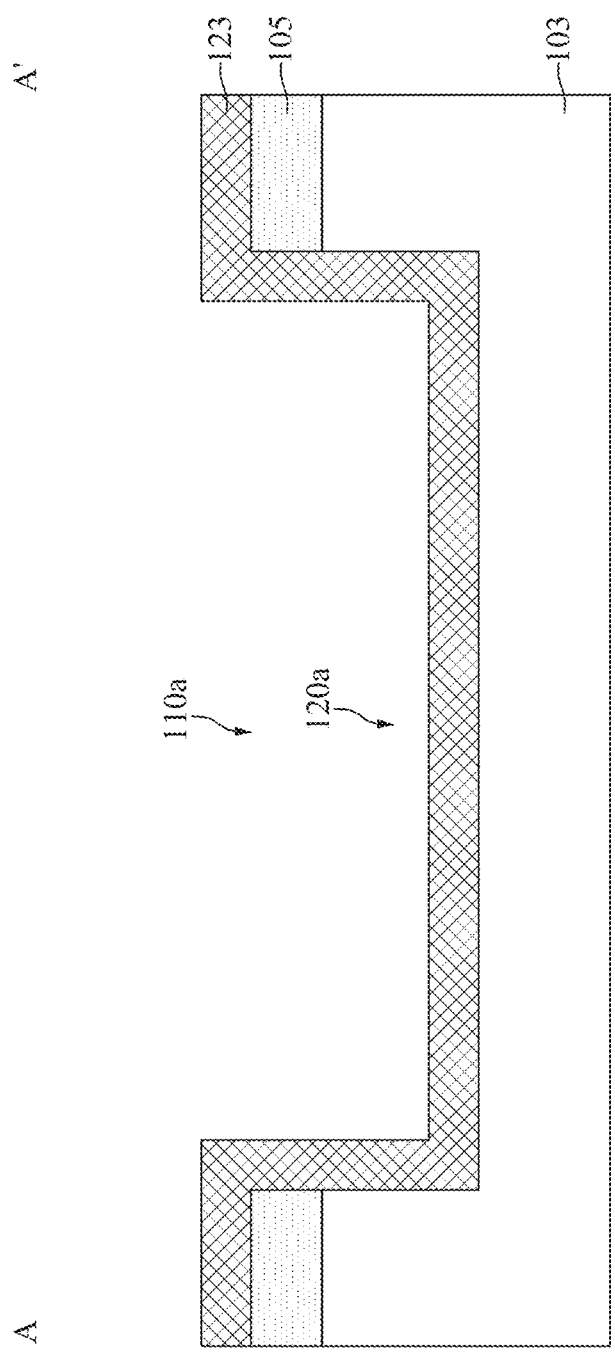
FIG. 10 is a cross-sectional view illustrating an intermediate stage of forming a lining material in the opening structure during the formation of the semiconductor device taken along the same sectional line as FIG. 8, in accordance with some embodiments.
Figure 11:
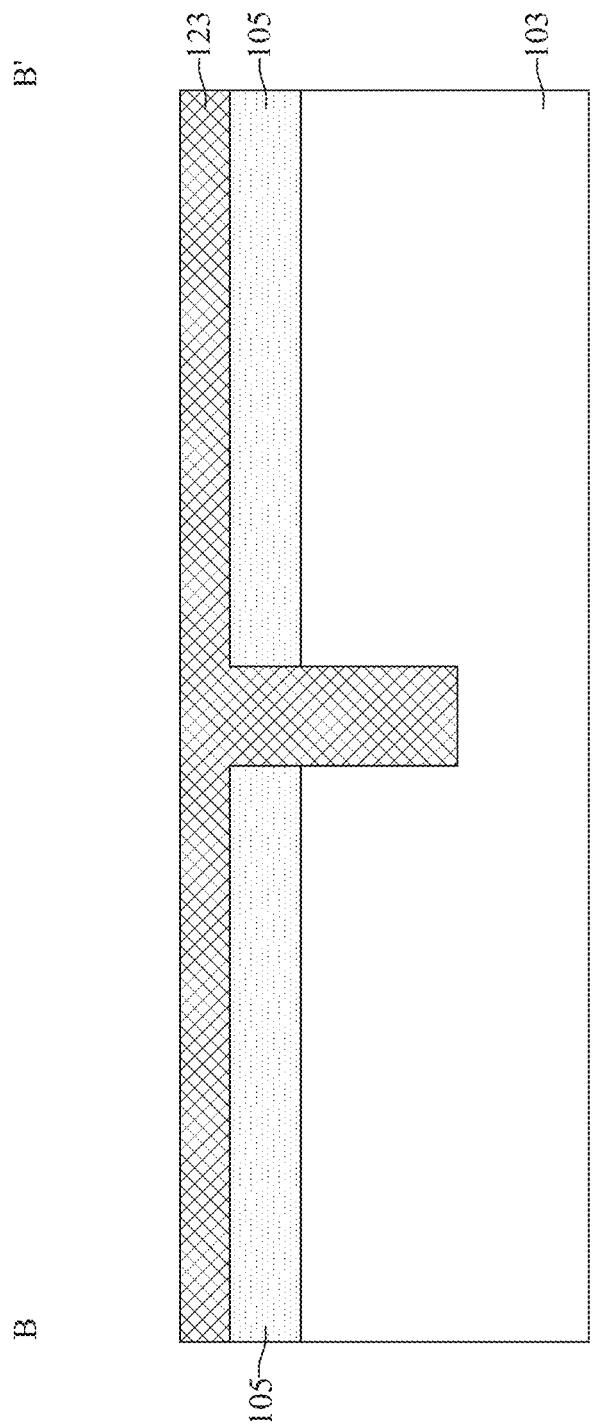
FIG. 11 is a cross-sectional view illustrating an intermediate stage of forming a lining material in the opening structure during the formation of the semiconductor device taken along the same sectional line as FIG. 9, in accordance with some embodiments.

FIGS. 10 and 11 are cross-sectional views illustrating an intermediate stage of forming a lining material 123 in the opening structures 110 and 120 during the formation of the semiconductor device 100, where FIG. 10 is taken along the same sectional line as FIG. 8 (i.e., the sectional line A-A'), and FIG. 11 is taken along the same sectional line as FIG. 9 (i.e., the sectional line B-B'), in accordance with some embodiments. As shown in FIGS. 10 and 11, the lining material 123 is conformally deposited in the opening structures 110 and 120, and over the top surface of the patterned mask 105. The respective step is illustrated as the step S13 in the method 10 shown in FIG. 5.

The first portions 110a, 120a and the second portions 110b, 120b of the opening structures 110 and 120 have widths that are greater than that of the third portions 110c, 120c of the opening structures 110 and 120. Therefore, the third portions 110c, 120c are completely filled by the lining material 123, while the first portions 110a, 120a and the second portions 110b, 120b are partially filled by the lining material 123. In particular, the sidewalls of the first portion 110a and the second portion 110b, and the bottom surfaces and the sidewalls of the first portion 120a and the second portion 120b are lined by the lining material 123. In some embodiments, the lining material 123 is made of CuMn, and is formed by a deposition process, such as a chemical vapor deposition (CVD) process, an atomic layer deposition (ALD) process, a physical vapor deposition (PVD) process, or a combination thereof.

Figure 12:
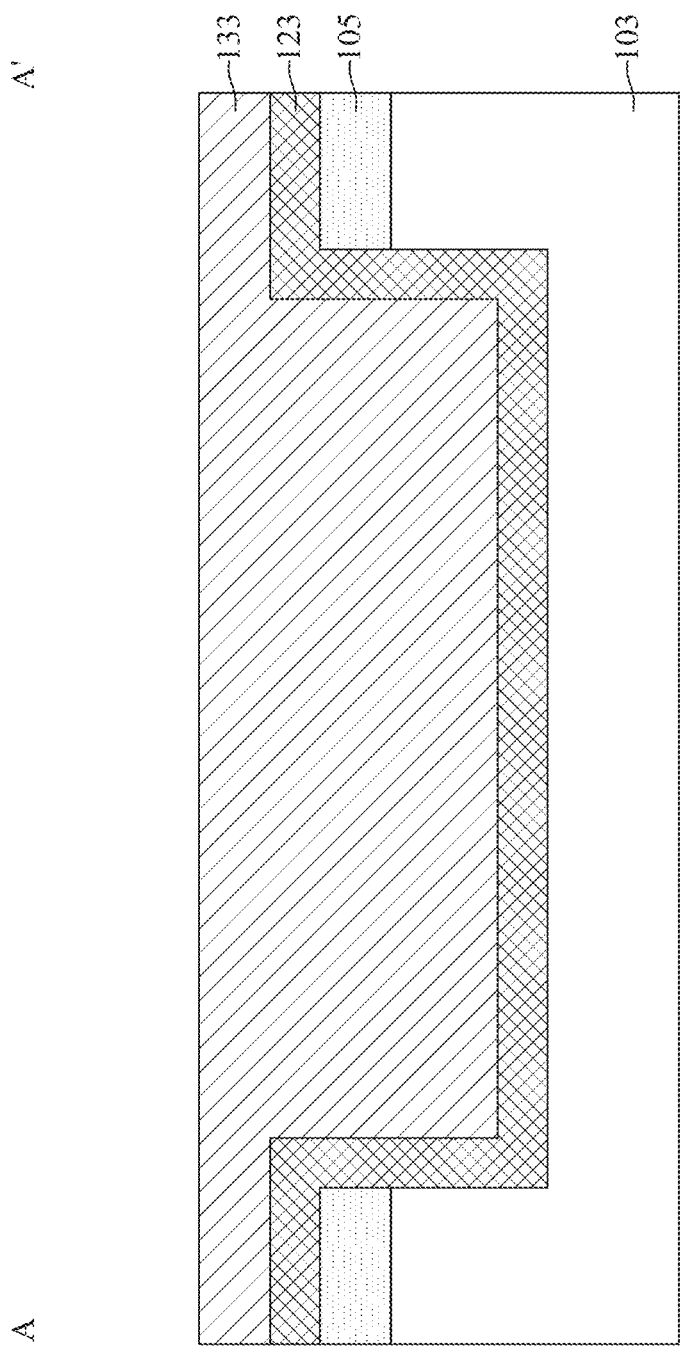
FIG. 12 is a cross-sectional view illustrating an intermediate stage of filling the opening structure with a conductive material during the formation of the semiconductor device taken along the same sectional line as FIG. 10, in accordance with some embodiments.
Figure 13:
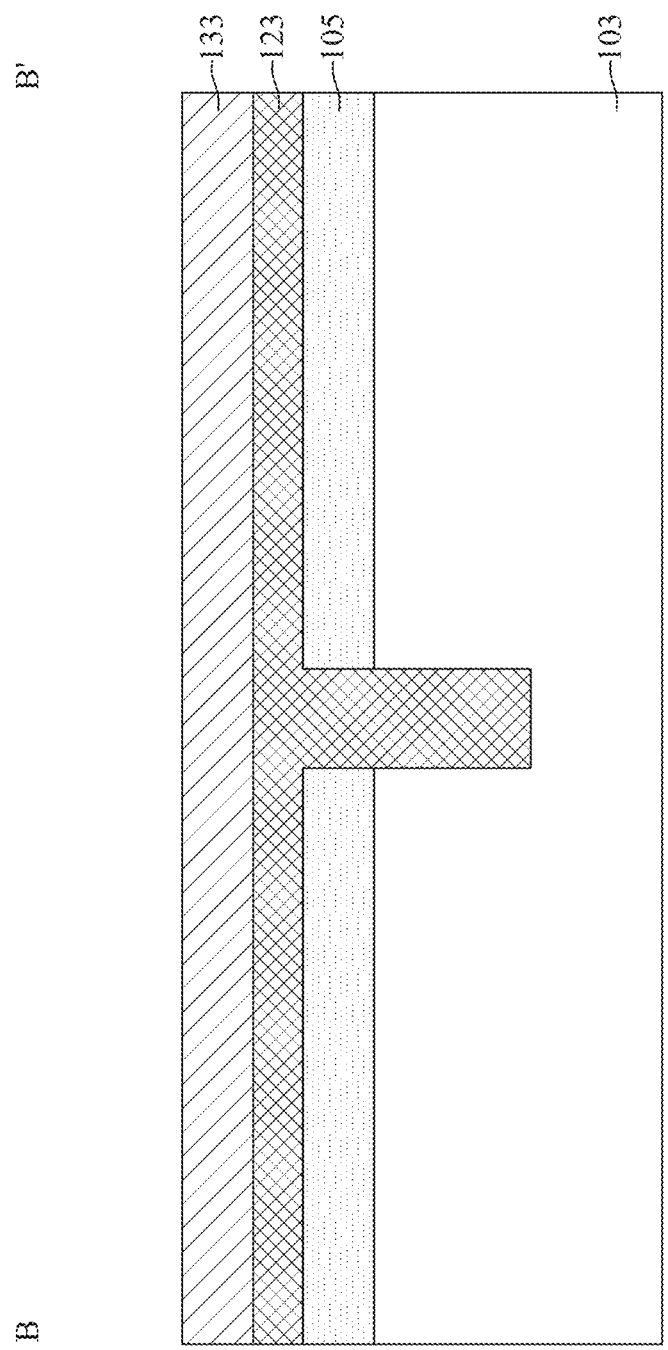
FIG. 13 is a cross-sectional view illustrating an intermediate stage of filling the opening structure with a conductive material during the formation of the semiconductor device taken along the same sectional line as FIG. 11, in accordance with some embodiments.

FIGS. 12 and 13 are cross-sectional views illustrating an intermediate stage of filling the opening structures 110 and 120 with a conductive material 133 during the formation of the semiconductor device 100, where FIG. 12 is taken along the same sectional line as FIG. 10 (i.e., the sectional line A-A'), and FIG. 13 is taken along the same sectional line as FIG. 11 (i.e., the sectional line B-B'), in accordance with some embodiments.

As shown in FIGS. 12 and 13, the conductive material 133 is formed in the opening structures 110 and 120, and over the top surface of the patterned mask 105. The respective step is illustrated as the step S15 in the method 10 shown in FIG. 5. In some embodiments, the conductive material 133 is made of Cu, and is formed by a deposition process, such as a CVD process, an ALD process, a PVD process, a sputtering process, a plating process, or a combination thereof. It should be noted that the remaining first portions 110a, 120a and the remaining second portions 110b, 120b of the opening structures 110, 120 are completely filled by the conductive material 133, in accordance with some embodiments.

Figure 14:
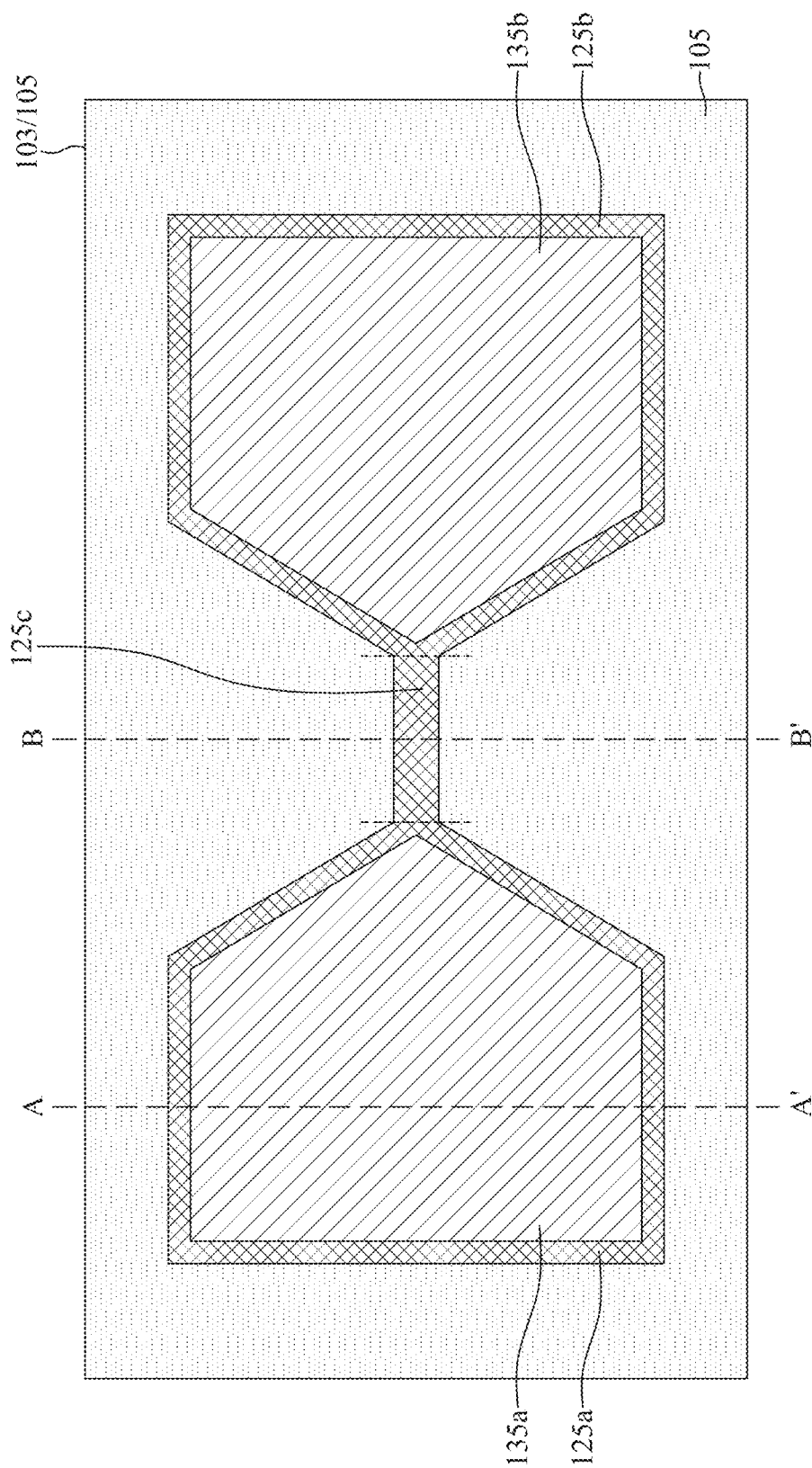
FIG. 14 is a top view illustrating an intermediate stage of performing a planarization process during the formation of the semiconductor device, in accordance with some embodiments.
Figure 15:
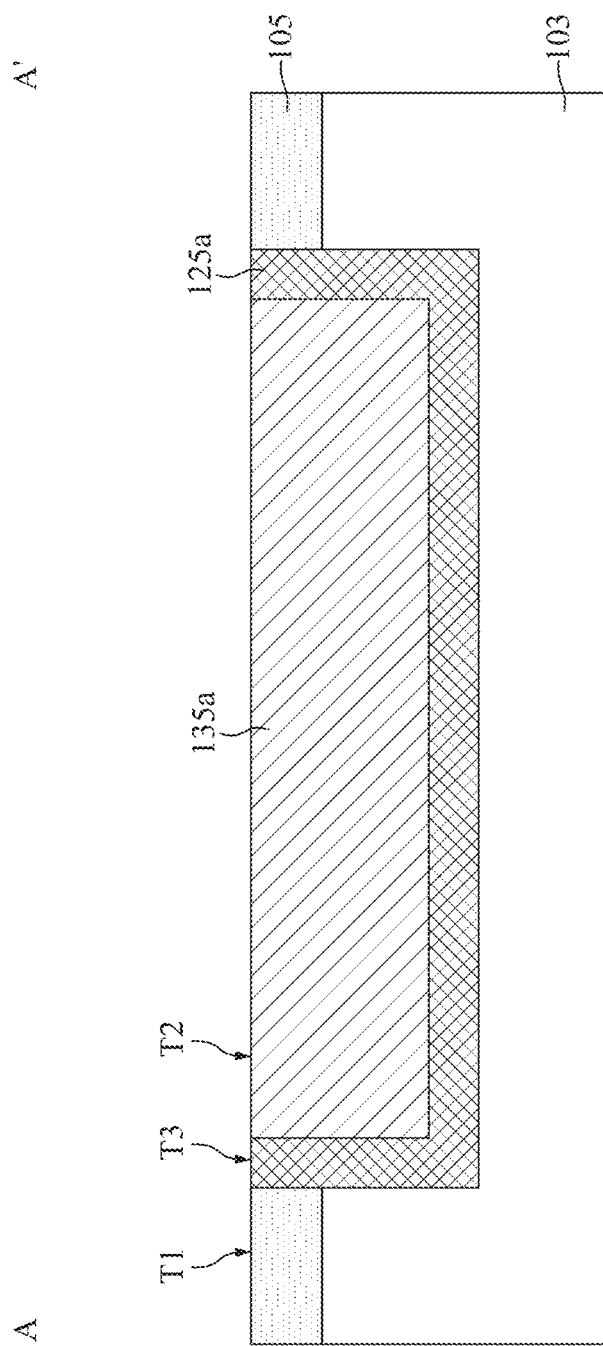
FIG. 15 is a cross-sectional view illustrating an intermediate stage in the formation of the semiconductor device along the sectional line A-A' of FIG. 14, in accordance with some embodiments.
Figure 16:
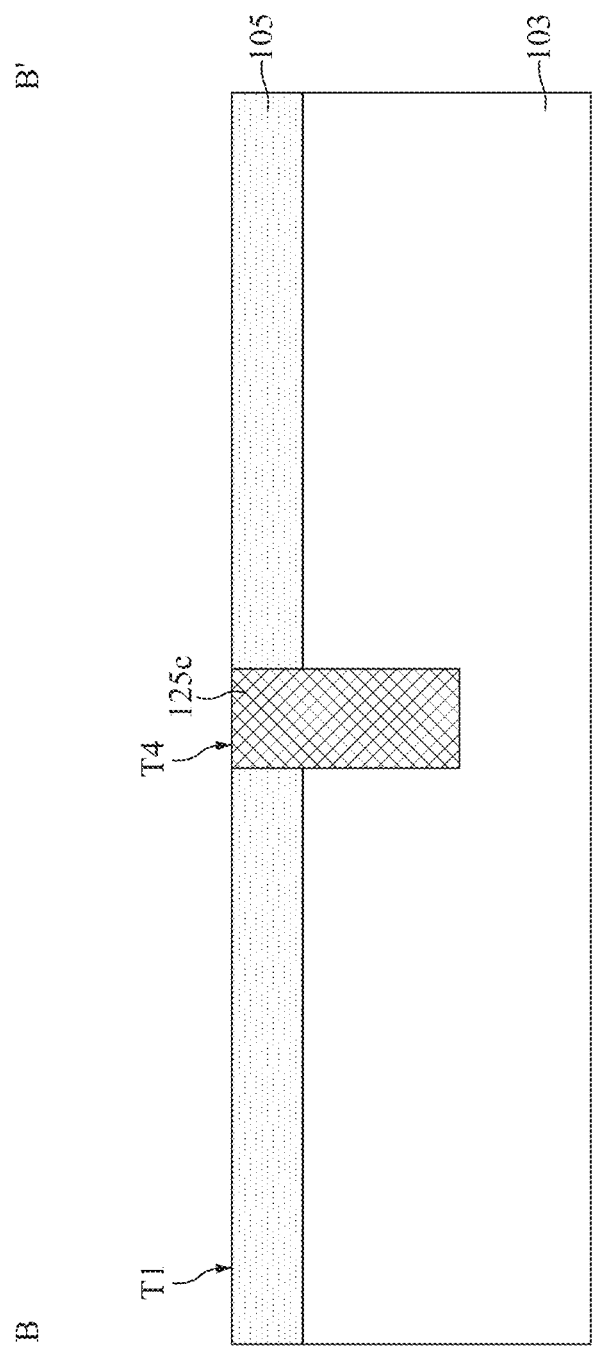
FIG. 16 is a cross-sectional view illustrating an intermediate stage in the formation of the semiconductor device along the sectional line B-B' of FIG. 14, in accordance with some embodiments.

FIG. 14 is a top view illustrating an intermediate stage of performing a planarization process during the formation of the semiconductor device 100, FIG. 15 is a cross-sectional view taken along the sectional line A-A' of FIG. 14, and FIG. 16 is a cross-sectional view taken along the sectional line B-B' of FIG. 14, in accordance with some embodiments. As shown in FIGS. 14 to 16, a planarization process is performed on the lining material 123 and the conductive material 133 until the top surface of the patterned mask 105 is exposed. The respective step is illustrated as the step S17 in the method 10 shown in FIG. 5.

The planarization process may include a chemical mechanical polishing (CMP) process. In some embodiments, the planarization process removes excess portions of the lining material 123 and the conductive materials 133 outside the opening structure 110 in the patterned mask 105 and the opening structure 120 in the first dielectric layer 103. As a result, a remaining portion of the lining material 123 in the first portions 110a and 120a of the opening structures 110 and 120 is configured as the first liner 125a, a remaining portion of the lining material 123 in the second portions 110b and 120b of the opening structures 110 and 120 is configured as the second liner 125b, and a remaining portion of the lining material 123 in the third portions 110c and 120c of the opening structures 110 and 120 is configured as the fuse link 125c.

Moreover, after the planarization process is performed, a remaining portion of the conductive material 133 in the first portions 110a and 120a of the opening structures 110 and 120 is configured as the first electrode 135a, and a remaining portion of the conductive material 133 in the second portions 110b and 120b of the opening structures 110 and 120 is configured as the second electrode 135b. As shown in FIGS. 15 and 16, the patterned mask 105 has a top surface T1, the first electrode 135a has a top surface T2, the first liner 125a has a top surface T3, and the fuse link 125c has a top surface T4. In some embodiments, the top surfaces T1, T2, T3 and T4 are substantially coplanar with each other. Within the context of this disclosure, the word "substantially" means preferably at least 90%, more preferably 95%, even more preferably 98%, and most preferably 99%.

Referring back to FIGS. 1 to 3, after the planarization process, the second dielectric layer 141 is formed over the patterned mask 105, in accordance with some embodiments. The respective step is illustrated as the step S19 in the method 10 shown in FIG. 5. The second dielectric layer 141 may include silicon oxide, silicon nitride, silicon oxynitride, a combination thereof, or another dielectric material, and may be formed by a deposition process, such as a CVD process, an ALD process, a PVD process, a spin-on coating process, or a combination thereof.

After the second dielectric layer 141 is formed, the conductive contacts 143 are formed penetrating through the second dielectric layer 141 to contact the first electrode 135a and the second electrode 135b, as shown in FIGS. 1 to 3 in accordance with some embodiments. The respective step is illustrated as the step S21 in the method 10 shown in FIG. 5. In some embodiments, the conductive contacts 143 are made of a conductive material, such as tungsten (W), aluminum (Al), titanium (T1), tantalum (Ta), gold (Au), silver (Ag), copper (Cu), or a combination thereof.

In some embodiments, the formation of the conductive contacts 143 includes forming a plurality of openings (not shown) in the second dielectric layer 141 to expose the top surfaces of the first electrode 135a and the second electrode 135b, and filling the openings with a conductive material. The openings may be formed by an etching process using a patterned mask as an etching mask, and the conductive material may be formed by a deposition process, such as a CVD process or an ALD process. Then, a planarization process, such as a CMP process, may be performed to remove any excess material over the top surface of the second dielectric layer 141.

After the formation of the conductive contacts 143, the semiconductor device 100 is obtained. In the present embodiments, the first liner 125a and the second liner 125b are made of CuMn, and the first electrode 135a and the second electrode 135b are made of Cu. The CuMn liners (i.e., the first liner 125a and the second liner 125b) may reduce or prevent voids from forming in the first electrode 135a and the second electrode 135b, thereby reducing the contact resistances and improving the electromigration reliabilities of the first electrode 135a and the second electrode 135b. As a result, the device performance may be improved. In addition, since the fuse link 125c, the first liner 125a and the second liner 125b can be formed using the same process and the same material, the process cost can be lowered.

Figure 17:
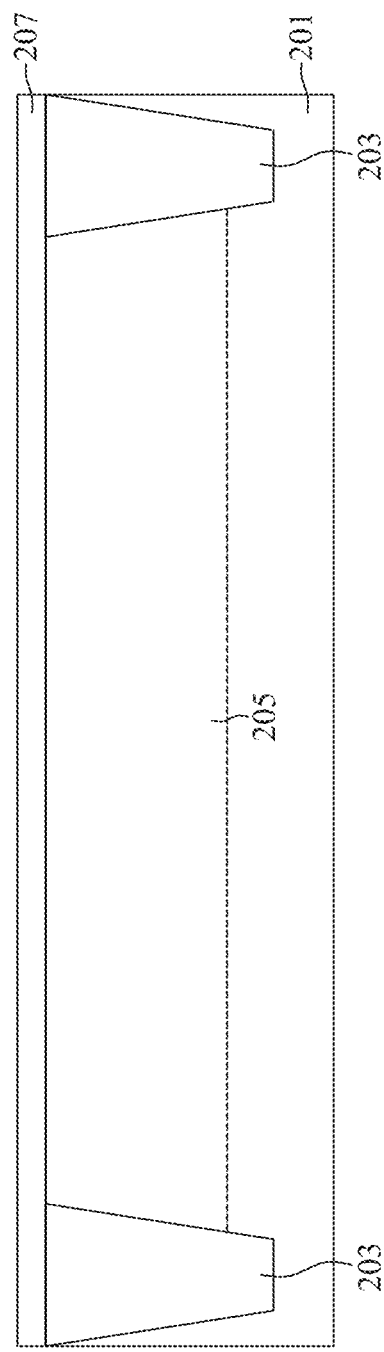
FIG. 17 is a cross-sectional view illustrating an intermediate stage of forming a first dielectric layer over a semiconductor substrate during the formation of the semiconductor device, in accordance with some other embodiments.

FIGS. 17 to 22 are cross-sectional views illustrating intermediate stages during the formation of the semiconductor device 200, in accordance with some embodiments. As shown in FIG. 17, the semiconductor substrate 201 is provided. The semiconductor substrate 201 may be a semiconductor wafer such as a silicon wafer.

Alternatively or additionally, the semiconductor substrate 201 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 201 includes an epitaxial layer. For example, the semiconductor substrate 201 has an epitaxial layer overlying a bulk semiconductor. In some embodiments, the semiconductor substrate 201 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 17, the isolation structures 203 are formed in the semiconductor substrate 201 to define the active regions, and the isolation structures 203 are shallow trench isolation (STI) structures, in accordance with some embodiments. In addition, the isolation structures 203 may be made of silicon oxide, silicon nitride, silicon oxynitride or another applicable dielectric material, and the formation of the isolation structures 203 may include forming a patterned mask (not shown) over the semiconductor substrate 201, etching the semiconductor substrate 201 to form openings (not shown) by using the patterned mask as an etching mask, depositing a dielectric material in the openings and over the semiconductor substrate 201, and planarizing the dielectric material until the semiconductor substrate 201 is exposed.

Moreover, in some embodiments, the deep well region 205 is formed in the active regions defined by the isolation structures 203. In some embodiments, the deep well region 205 is formed by one or more ion implantation processes, and P-type dopants, such as boron (B), gallium (Ga), or indium (In), or N-type dopants, such as phosphorous (P) or arsenic (As), can be implanted in the semiconductor substrate 201 to form the deep well region 205, depending on the conductivity type of the semiconductor device 200.

Still referring to FIG. 17, the first dielectric layer 207 is formed over the semiconductor substrate 201 and covering the isolation structures 203 and the deep well region 205, in accordance with some embodiments. In some embodiments, the first dielectric layer 207 is made of silicon oxide, silicon nitride, silicon oxynitride, a combination thereof, or another dielectric material, and is formed by a deposition process, such as a CVD process, an ALD process, a PVD process, a spin-on coating process, or a combination thereof.

Figure 18:
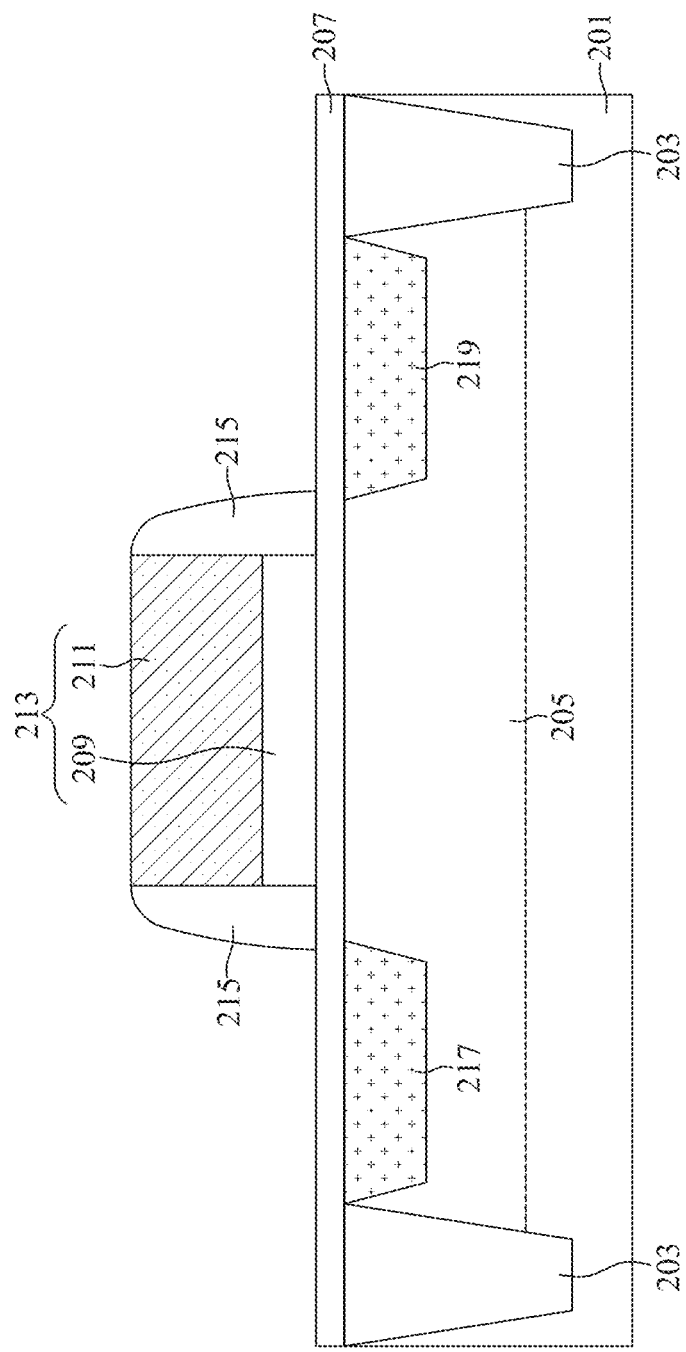
FIG. 18 is a cross-sectional view illustrating an intermediate stage of forming a gate structure over the first dielectric layer and forming well regions in the semiconductor substrate during the formation of the semiconductor device, in accordance with some other embodiments.

Next, the gate structure 213 including the gate dielectric layer 209 and the gate electrode layer 211 is formed over the first dielectric layer 207, and the gate spacers are formed on opposite sidewalls of the gate structure 213, as shown in FIG. 18 in accordance with some embodiments. The respective step is illustrated as the step S33 in the method 30 shown in FIG. 6. In some embodiments, the gate dielectric layer 209 is made of silicon oxide, silicon carbide, silicon nitride, silicon oxynitride, a dielectric material with high dielectric constant (high-k), or a combination thereof, and the gate electrode layer 211 is made of polysilicon, a metal material (e.g., aluminum (Al), copper (Cu), tungsten (W), titanium (T1), tantalum (Ta)), a metal silicide material, or a combination thereof.

In some embodiments, the formation of the gate structure 213 includes sequentially forming a gate dielectric material (not shown) and a gate electrode material (not shown) over the first dielectric layer 207 by deposition processes. The deposition process may include CVD, ALD, PVD, sputtering, electroplating, or a combination thereof. Then, an etching process is performed on the gate dielectric material and the gate electrode material using a patterned mask (not shown) as an etching mask. The etching process may include a wet etching process, a dry etching process, or a combination thereof. After the gate structure 213 is formed, the patterned mask may be removed.

In some embodiments, the gate spacers 215 are made of silicon oxide, silicon carbide, silicon nitride, silicon oxynitride, another applicable dielectric material, or a combination thereof. In some embodiments, the formation of the gate spacers 215 includes conformally depositing a spacer material (not shown) on the top surface and the sidewalls of the gate structure 213 and on the top surface of the first dielectric layer 207. The deposition process may include a CVD process, a PVD process, an ALD process, a spin-on coating process, or another applicable process. Then, the spacer material is etched by an anisotropic etching process, which removes the same amount of the spacer material vertically in all places, leaving the gate spacers 215 on the sidewalls of the gate structure 213. In some embodiments, the etching process is a dry etching process.

Moreover, the first well region 217 and the second well region 219 are formed in the semiconductor substrate 201 after the gate spacers 215 are formed. In some embodiments, the first well region 217 and the second well region 219 are formed in the deep well region 205 and on opposite sides of the gate structure 213. The respective step is illustrated as the step S35 in the method 30 shown in FIG. 6. In some embodiments, the first well region 217 and the second well region 219 are formed by an ion implantation process using the gate structure 213 and the gate spacers 215 as an implanting mask.

Some dopants used to form the first well region 217 and the second well region 219 are similar to, or the same as those used to form the deep well region 205, and details thereof are not repeated herein. In some embodiments, the conductivity type of the dopants in the first well region 217 is the same as the conductivity type of the dopants in the second well region 219, and the conductivity type of the dopants in the first well region 217 is opposite to the conductivity type of the dopants in the deep well region 205. In addition, the implantation dose of the first well region 217 and the second well region 219 may be greater than that of the deep well region 205.

Figure 19:
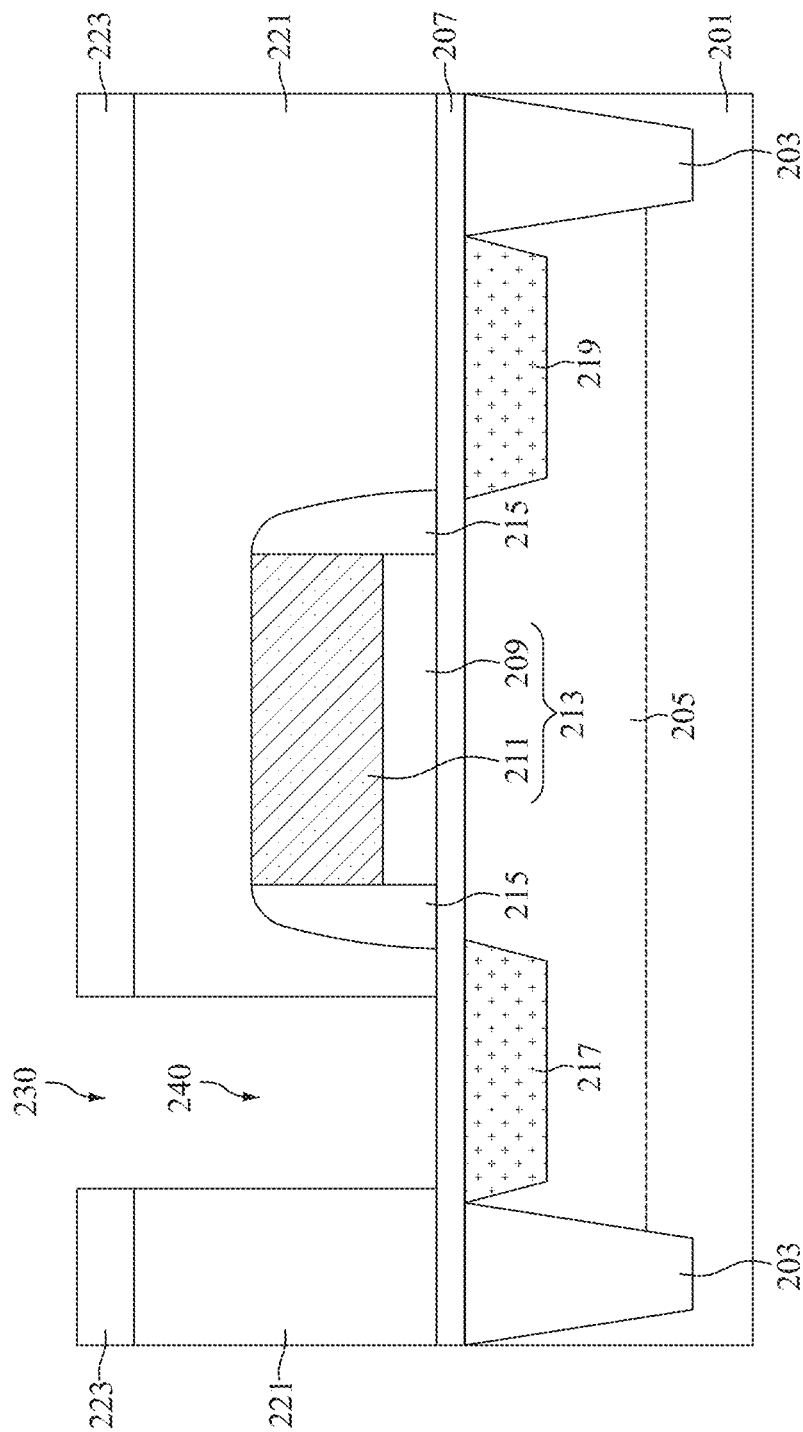
FIG. 19 is a cross-sectional view illustrating an intermediate stage of forming a second dielectric layer over the first dielectric layer and forming an opening in the second dielectric layer during the formation of the semiconductor device, in accordance with some other embodiments.

Subsequently, the second dielectric layer 221 is formed over the first dielectric layer 207 and covering the gate structure 213 and the gate spacers 215, as shown in FIG. 19 in accordance with some embodiments. The respective step is illustrated as the step S37 in the method 30 shown in FIG. 6. The second dielectric layer 221 may include silicon oxide, silicon nitride, silicon oxynitride, a combination thereof, or another dielectric material, and may be formed by a deposition process, such as a CVD process, an ALD process, a PVD process, a spin-on coating process, or a combination thereof. In some embodiments, the second dielectric layer 221 and the first dielectric layer 207 are made of different materials.

Still referring to FIG. 19, a patterned mask 223 with an opening 230 is formed over the second dielectric layer 221, and an etching process is performed on the second dielectric layer 221 by using the patterned mask 223 as an etching mask, such that the opening 230 is transferred from the patterned mask 223 to the second dielectric layer 221, and an opening 240 exposing the first dielectric layer 207 is obtained, in accordance with some embodiments. In some embodiments, the openings 230 and 240 are formed over the first well region 217. In some embodiments, the etching process includes a wet etching process, a dry etching process, or a combination thereof.

Figure 20:
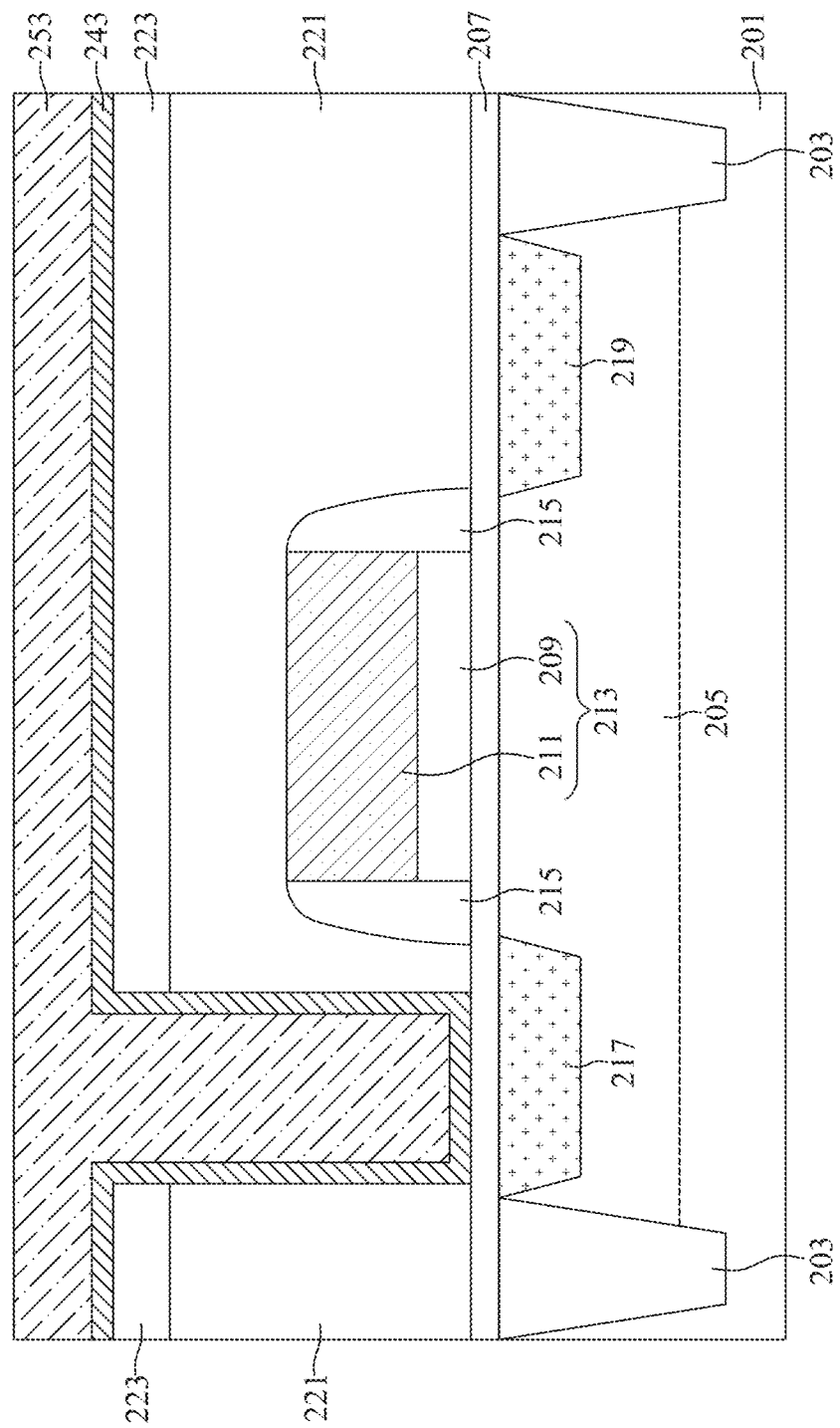
FIG. 20 is a cross-sectional view illustrating an intermediate stage of sequentially forming a barrier material and a conductive material in the opening during the formation of the semiconductor device, in accordance with some other embodiments.

After the opening 240 is formed in the second dielectric layer 221, a barrier material 243 and a conductive material 253 is sequentially formed in the openings 230 and 240, and over the top surface of the patterned mask 223, as shown in FIG. 20 in accordance with some embodiments. In some embodiments, the conductive material 253 is separated from the first dielectric layer 207, the second dielectric layer 221 and the patterned mask 223 by the barrier material 243.

In some embodiments, the barrier material 243 is made of CuMn, and is formed by a deposition process, such as a CVD process, an ALD process, a PVD process, or a combination thereof. In some embodiments, the conductive material 253 is made of Cu, and is formed by a deposition process, such as a CVD process, an ALD process, a PVD process, a sputtering process, a plating process, or a combination thereof.

Figure 21:
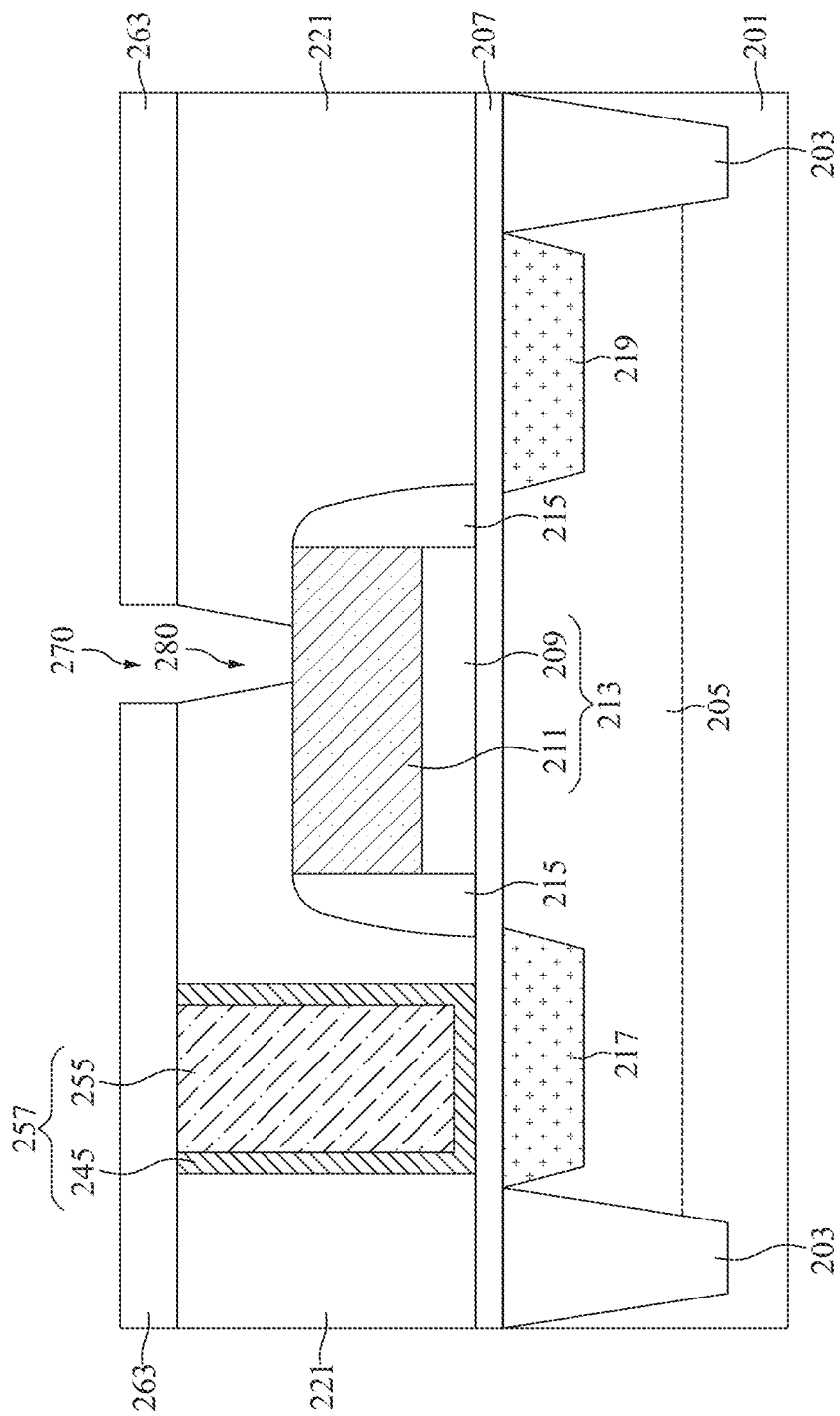
FIG. 21 is a cross-sectional view illustrating an intermediate stage of planarizing the barrier material and the conductive material during the formation of the semiconductor device, in accordance with some other embodiments.

Next, a planarization process, such as a CMP process, is performed on the patterned mask 223, the barrier material 243 and the conductive material 253 to remove any excess material over the top surface of the second dielectric layer 221, such that the conductive structure 257 including the conductive plug 255 and the barrier layer 245 is obtained, as shown in FIG. 21 in accordance with some embodiments. The respective step is illustrated as the step S39 in the method 30 shown in FIG. 6.

Still referring to FIG. 21, a patterned mask 263 with an opening 270 is formed over the second dielectric layer 221, and an etching process is performed on the second dielectric layer 221 by using the patterned mask 263 as an etching mask, such that the opening 270 is transferred from the patterned mask 263 to the second dielectric layer 221, and an opening 280 exposing the gate structure 213 is obtained, in accordance with some embodiments. Specifically, a portion of the gate electrode layer 211 is exposed by the opening 280. In some embodiments, the etching process includes a wet etching process, a dry etching process, or a combination thereof.

Figure 22:
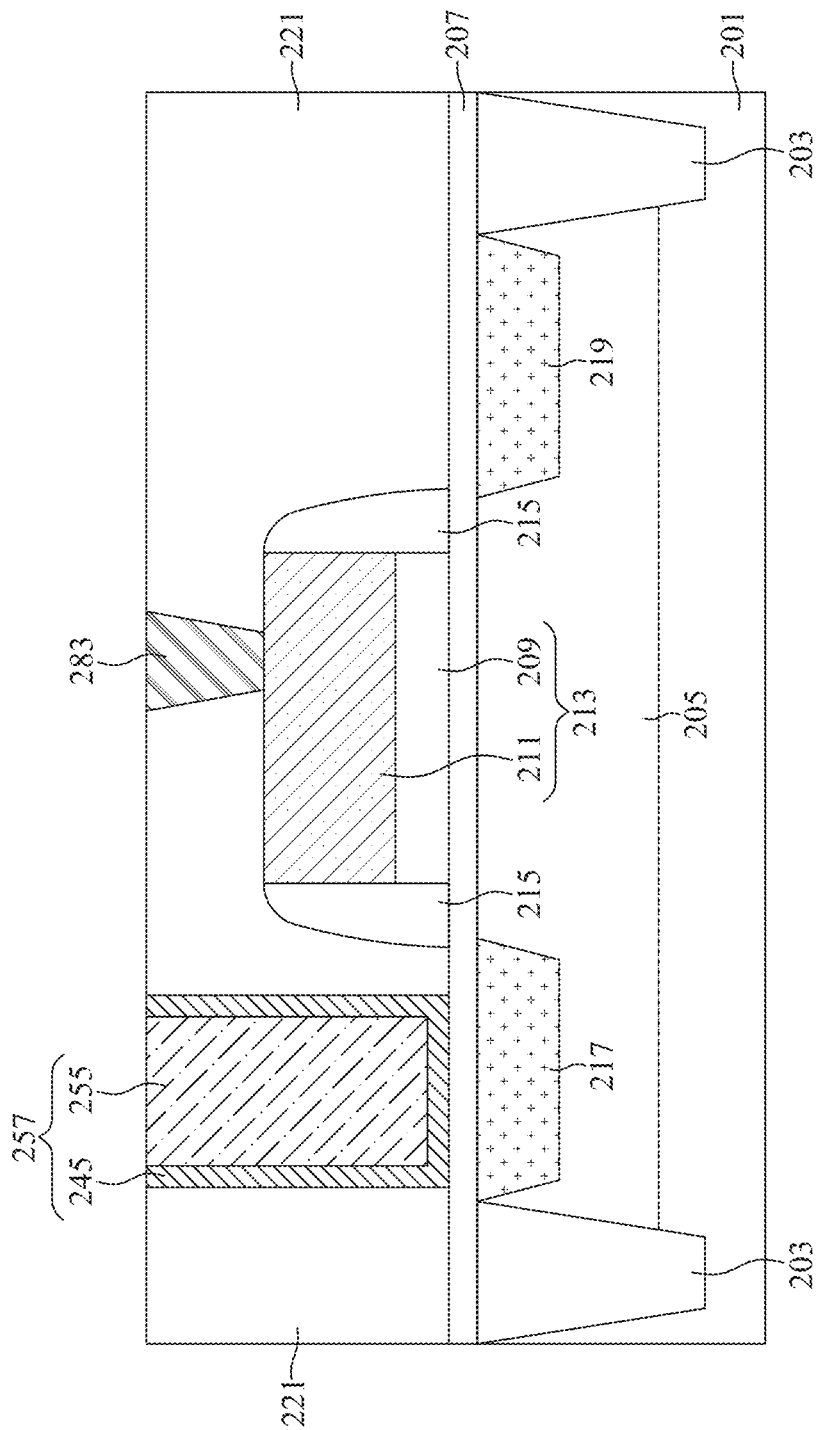
FIG. 22 is a cross-sectional view illustrating an intermediate stage of forming a gate conductive plug over the gate structure during the formation of the semiconductor device, in accordance with some other embodiments.

After the opening 280 over the gate structure 213 is formed, the gate conductive plug 283 is formed filling the opening 280, as shown in FIG. 22 in accordance with some embodiments. The respective step is illustrated as the step S41 in the method 30 shown in FIG. 6. In some embodiments, the gate conductive plug 283 is made of a conductive material, such as tungsten (W), aluminum (Al), titanium (Ti), tantalum (Ta), gold (Au), silver (Ag), copper (Cu), or a combination thereof. The formation of the gate conductive plug 283 may include a deposition process (e.g., CVD, ALD, and PVD) and a subsequent planarization process (e.g., CMP).

Referring back to FIG. 4, the third dielectric layer 291 is formed over the second dielectric layer 221, and the conductive layers 293 and 295 are formed in the third dielectric layer 291, in accordance with some embodiments. The respective step is illustrated as the step S43 in the method 30 shown in FIG. 6. Some materials and processes used to form the third dielectric layer 291 are similar to, or the same as those used to form the second dielectric layer 221, and details thereof are not repeated herein.

In some embodiments, the conductive layer 293 is formed over and electrically connected to the conductive structure 257, and the conductive layer 295 is formed over and electrically connected to the gate conductive plug 283. In some embodiments, the conductive layers 293 and 295 are made of a conductive material, such as tungsten (W), aluminum (Al), titanium (Ti), tantalum (Ta), gold (Au), silver (Ag), copper (Cu), or a combination thereof. The formation of the conductive layers 293 and 295 may include forming openings (not shown) in the third dielectric layer 291 using a patterned mask as an etching mask, forming a conductive material in the openings and over the third dielectric layer 291, and performing a planarization process (e.g., CMP) to remove any excess material over the top surface of the third dielectric layer 291.

After the formation of the conductive layers 293 and 295, the semiconductor device 200 with the anti-fuse structure 300 is obtained. In the present embodiments, the barrier layer 245 is made of CuMn, and the conductive plug 255 is made of Cu. The CuMn liners (i.e., the barrier layer 245) may reduce or prevent voids from forming in the conductive plug 255, thereby reducing the contact resistance and improving the electromigration reliability of the conductive plug 255. As a result, the device performance may be improved.

Embodiments of the semiconductor device 100 and 200 and method for forming the same are provided in the disclosure. In some embodiments, the CuMn liners (i.e., the first liner 125a and the second liner 125b in the semiconductor device 100, and the barrier layer 245 in the semiconductor device 200) surrounding the copper conductive structures (i.e., the first electrode 135a and the second electrode 135b in the semiconductor device 100, and the conductive plug 255 in the semiconductor device 200) may reduce or prevent voids from forming in the conductive structures, thereby reducing the contact resistances and improving the electromigration reliabilities of the conductive structures. As a result, the device performance may be improved.

In one embodiment of the present disclosure, a semiconductor device is provided. The semiconductor device includes a first electrode and a second electrode disposed in a first dielectric layer. The semiconductor device also includes a first liner separating the first electrode from the first dielectric layer. The semiconductor device further includes a fuse link disposed in the first dielectric layer. The fuse link is disposed between and electrically connected to the first electrode and the second electrode, and the fuse link and the first liner are made of copper-manganese (CuMn).

In another embodiment of the present disclosure, a semiconductor device is provided. The semiconductor device includes a first well region and a second well region disposed in a semiconductor substrate. The semiconductor device also includes a first dielectric layer disposed over the semiconductor substrate and covering the first well region and the second well region, and a gate structure disposed over the first dielectric layer and between the first well region and the second well region. The semiconductor device further includes a conductive structure disposed over and separated from the first well region by a portion of the first dielectric layer. The conductive feature includes a barrier layer and a conductive plug disposed over the barrier layer, and the barrier layer is made of copper-manganese (CuMn). The first well region, the conductive structure and the portion of the first dielectric layer form an anti-fuse structure.

In yet another embodiment of the present disclosure, a method for forming a semiconductor device is provided. The method includes forming an opening structure in a first dielectric layer. The opening structure has a first portion, a second portion and a third portion disposed between and physically connecting the first portion and the second portion. The method also includes forming a lining material lining the first portion and the second portion of the opening structure and completely filling the third portion of the opening structure. The lining material is made of copper-manganese (CuMn). The method further includes filling the first portion and the second portion of the opening structure with a conductive material after the lining material is formed, and performing a planarization process on the lining material and the conductive material.

The embodiments of the present disclosure have some advantageous features. By forming a CuMn liner surrounding the conductive structure, the formation of voids in the conductive structure may be reduced or prevented, which reduces the contact resistance and improves the electromigration reliability of the conductive structure. As a result, the device performance may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a first electrode and a second electrode disposed in a first dielectric layer;
a first liner separating the first electrode from the first dielectric layer; and
a fuse link disposed in the first dielectric layer, wherein the fuse link is disposed between and electrically connected to the first electrode and the second electrode, and wherein the fuse link and the first liner are formed of a lining material including copper-manganese (CuMn), wherein the first liner, the fuse link are physically connected to form a continuous structure.

2. The semiconductor device of claim 1, wherein the first electrode and the second electrode include copper (Cu).

3. The semiconductor device of claim 1, further comprising:
a second liner separating the second electrode from the first dielectric layer, wherein the second liner, the fust link and the first liner are formed of the lining material including CuMn, wherein the first liner, the second liner and the fuse link are physically connected to form a continuous structure.

4. The semiconductor device of claim 3, wherein the first liner, the second liner and the fuse link are connected to form a continuous structure.

5. The semiconductor device of claim 1, wherein a top surface of the first liner is coplanar with a top surface of the first electrode.

6. The semiconductor device of claim 1, further comprising:
a second dielectric layer disposed over the first dielectric layer; and
a plurality of conductive contacts disposed in the second dielectric layer, wherein a first set of the plurality of conductive contacts is electrically connected to the first electrode, and a second set of the plurality of conductive contacts is electrically connected to the second electrode.

7. The semiconductor device of claim 6, further comprising:
a patterned mask disposed between the first dielectric layer and the second dielectric layer, wherein a top surface of the fuse link is coplanar with a top surface of the patterned mask.

* * * * *